(12) United States Patent
Takahashi et al.

(10) Patent No.: US 10,861,865 B2
(45) Date of Patent: Dec. 8, 2020

(54) SEMICONDUCTOR STORAGE DEVICE

(71) Applicant: Toshiba Memory Corporation, Minato-ku (JP)

(72) Inventors: Yoshiaki Takahashi, Yokohama (JP); Takahiro Tsurudo, Yokohama (JP); Kiyofumi Sakurai, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/561,917

(22) Filed: Sep. 5, 2019

(65) Prior Publication Data

US 2020/0295024 A1 Sep. 17, 2020

(30) Foreign Application Priority Data

Mar. 15, 2019 (JP) ................................ 2019-049019

(51) Int. Cl.
*G11C 16/04* (2006.01)
*H01L 27/11573* (2017.01)
(Continued)

(52) U.S. Cl.
CPC .... *H01L 27/11573* (2013.01); *G11C 11/5642* (2013.01); *G11C 11/5671* (2013.01);
(Continued)

(58) Field of Classification Search
CPC ............ G11C 11/5642; G11C 11/5671; G11C 16/0483; G11C 16/24; G11C 16/26;
(Continued)

(56) References Cited

U.S. PATENT DOCUMENTS 8,040,715 B2 * 10/2011 Takase ................... G11C 13/00
365/148
8,223,536 B2 7/2012 Tonomura et al.
(Continued)

FOREIGN PATENT DOCUMENTS

JP 2019-36374 A 3/2019

OTHER PUBLICATIONS

Office Action dated Sep. 26, 2020 issued in corresponding Taiwanese Patent Application No. 108123364 (with English translation).

*Primary Examiner* — Pho M Luu
(74) *Attorney, Agent, or Firm* — Oblon, McClelland, Maier & Neustadt, L.L.P.

(57) ABSTRACT

A semiconductor storage device includes first high-potential wirings, second high-potential wirings, a first low-potential wiring, a second low-potential wiring, a first branch wiring, and a second branch wiring formed in a wiring layer between a memory cell array and a semiconductor substrate and each extending in a first direction. The first branch wiring is electrically connected to the first low-potential wiring, and is adjacent to the first low-potential wiring on one side in a second direction perpendicular to the first direction of the first low-potential wiring. The second branch wiring is electrically connected to the second low-potential wiring, and is adjacent to the second low-potential wiring on the other side in the second direction of the second low-potential wiring. A first via is provided to contact the first branch wiring, and a second via is provided to contact the second branch wiring.

20 Claims, 15 Drawing Sheets

(51) Int. Cl.
*H01L 27/11556* (2017.01)
*H01L 23/528* (2006.01)
*H01L 23/522* (2006.01)
*H01L 27/11526* (2017.01)
*G11C 16/24* (2006.01)
*G11C 11/56* (2006.01)
*H01L 27/11548* (2017.01)
*H01L 27/11575* (2017.01)
*H01L 27/11582* (2017.01)
*G11C 16/26* (2006.01)

(52) U.S. Cl.
CPC .......... *G11C 16/0483* (2013.01); *G11C 16/24* (2013.01); *G11C 16/26* (2013.01); *H01L 23/5226* (2013.01); *H01L 23/5283* (2013.01); *H01L 27/11526* (2013.01); *H01L 27/11548* (2013.01); *H01L 27/11556* (2013.01); *H01L 27/11575* (2013.01); *H01L 27/11582* (2013.01)

(58) Field of Classification Search
CPC .......... H01L 27/11573; H01L 11/5642; H01L 11/5671; H01L 23/5226; H01L 23/5283; H01L 27/11526; H01L 27/27; H01L 27/11548; H01L 27/11575; H01L 27/11583
See application file for complete search history.

(56) References Cited

U.S. PATENT DOCUMENTS

| | | | |
|---|---|---|---|
| 9,196,375 B2* | 11/2015 | Kumazaki | .......... G11C 16/0483 |
| 9,905,756 B2* | 2/2018 | Sasago | .................... H01L 45/06 |
| 10,074,659 B2 | 9/2018 | Funane | |
| 10,115,709 B1 | 10/2018 | Sasaki et al. | |
| 2019/0050169 A1 | 2/2019 | Komai | |

* cited by examiner

SEMICONDUCTOR STORAGE DEVICE

CROSS-REFERENCE TO RELATED APPLICATIONS

This application is based upon and claims the benefit of priority from the prior Japanese Patent Application No. 2019-49019 filed in Japan on Mar. 15, 2019; the entire contents of which are incorporated herein by reference.

FIELD

The present invention herein relates generally to a semiconductor storage device.

BACKGROUND

There has been known a semiconductor device such as a NAND-type flash memory. A semiconductor storage device includes a wiring layer having a plurality of wiring patterns formed therein. The plurality of wiring patterns include a plurality of wiring patterns respectively having different potentials.

If two wiring patterns respectively having different potentials are adjacent to each other, the wiring patterns are formed at a wiring pitch considering a withstand voltage. More specifically, the two wiring patterns respectively having different potentials and a via and the wiring patterns need to be respectively spaced apart from each other in consideration of a withstand voltage.

On the other hand, in lithography in semiconductor manufacturing processes, each of isolated patterns becomes a danger point so that a defect easily occurs. Accordingly, in the lithography, each of the isolated patterns does not more easily become a danger point when a space between two wiring patterns is a minimum space which is allowed in terms of process, and rather becomes a danger point so that a defect easily occurs when the space between the two wiring patterns is larger than the minimum space which is allowed in terms of process. Generally, the minimum space which is allowed in terms of process for the adjacent two wiring patterns is smaller than a space considering a withstand voltage. Therefore, when the space between the two wiring patterns is widened in consideration of a withstand voltage, a danger point due to the lithography may occur. In this case, a width of each of the wiring patterns needs to be increased, for example, which can lead to an increase in a chip area.

DETAILED DESCRIPTION

A semiconductor storage device according to an embodiment includes a memory cell array including a plurality of memory cells each settable to any one of threshold voltages at a plurality of levels, a plurality of first high-potential wirings which are formed in a wiring layer between the memory cell array and a semiconductor substrate, at least respective portions of which extend in a first direction, which are adjacent to one another with a first distance in a second direction perpendicular to the first direction, and to which a high potential is applied, a plurality of second high-potential wirings which are formed in the wiring layer, at least respective portions of which extend in the first direction, which are adjacent to one another with the first distance in the second direction, and to which the high potential is applied, a first low-potential wiring which is formed in the wiring layer, at least a portion of which extends in the first direction, and which is adjacent to the first high-potential wiring positioned on one side in the second direction among the plurality of first high-potential wirings with a second distance, a second low-potential wiring which is formed in the wiring layer, at least a portion of which extends in the first direction, and which is adjacent to the second high-potential wiring positioned on another side in the second direction among the plurality of second high-potential wirings with the second distance, a first branch wiring which is electrically connected to the first low-potential wiring, is adjacent to the first low-potential wiring with a third distance on the one side in the second direction of the first low-potential wiring, and extends in the first direction, a second branch wiring which is electrically connected to the second low-potential wiring, is adjacent to the second low-potential wiring with the third distance on the other side in the second direction of the second low-potential wiring, and extends in the first direction, a first via provided to contact the first branch wiring, and a second via provided to contact the second branch wiring.

An embodiment of the present invention will be described below with reference to the drawings.

(Configuration of Memory System)

Figure 1:
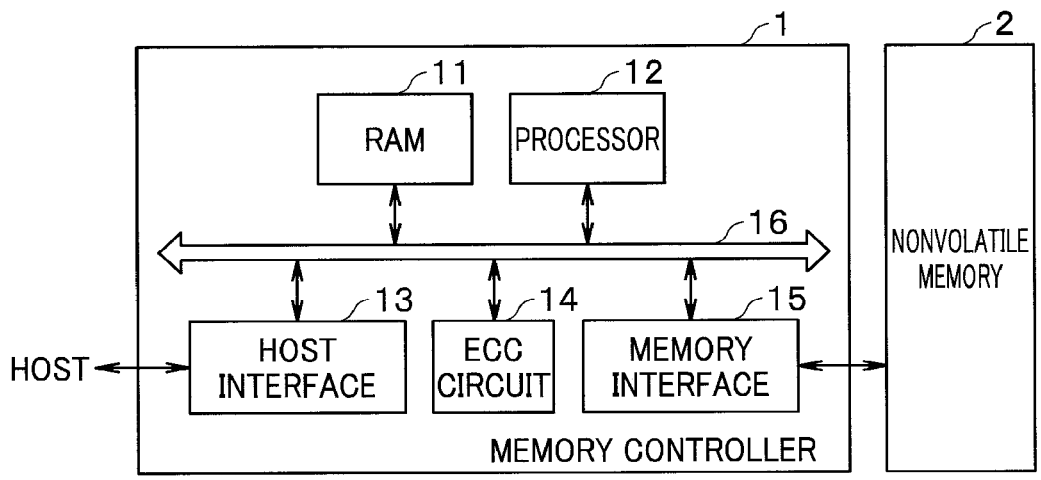
FIG. 1 is a block diagram illustrating an example of a configuration of a memory system according to an embodiment.

FIG. 1 is a block diagram illustrating an example of a configuration of a memory system according to an embodiment. The memory system according to the present embodiment includes a memory controller 1 and a nonvolatile memory 2. The memory system is connectable to a host. Examples of the host include electronic devices such as a personal computer and a portable terminal.

The nonvolatile memory 2 is a semiconductor storage device configured to store data in a nonvolatile manner, and includes a NAND flash memory, for example. In the present embodiment, the nonvolatile memory 2 will be described as a NAND memory having memory cells each capable of storing three bits, i.e., a 3 bit/cell (TLC: triple level cell) NAND memory. The nonvolatile memory 2 is three-dimensionalized.

The memory controller 1 controls writing of data into the nonvolatile memory 2 according to a writing request from the host. The memory controller 1 controls reading of data from the nonvolatile memory 2 according to a reading request from the host. The memory controller 1 includes a RAM (random access memory) 11, a processor 12, a host interface 13, an ECC (error check and correct) circuit 14, and a memory interface 15. The RAM 11, the processor 12, the host interface 13, the ECC circuit 14, and the memory interface 15 are connected to one another via an internal bus 16.

The host interface 13 outputs to the internal bus 16 a request received from the host, write data as user data, and the like. The host interface 13 transmits to the host user data read out of the nonvolatile memory 2, a response from the processor 12, and the like. The memory interface 15 controls, based on an instruction from the processor 12, processing for writing user data and the like into the nonvolatile memory 2 and processing for reading out user data and the like from the nonvolatile memory 2.

The processor 12 integrally controls the memory controller 1. Examples of the processor 12 include a CPU (central processing unit) and an MPU (micro processing unit). When receiving a request from the host via the host interface 13, the processor 12 performs control according to the request. For example, the processor 12 instructs the memory interface 15 to write user data and a parity into the nonvolatile memory 2 according to the request from the host. The processor 12 instructs the memory interface 15 to read out the user data and the parity from the nonvolatile memory 2 according to the request from the host.

The processor 12 determines a storage region (hereinafter referred to as a memory region) on the nonvolatile memory 2 for user data to be accumulated in the RAM 11. The user data is stored in the RAM 11 via the internal bus 16. The processor 12 determines the memory region for data in a page unit as a writing unit, i.e., page data. In the present specification, user data to be stored in one page of the nonvolatile memory 2 is defined as unit data. The unit data is encoded and stored in the nonvolatile memory 2 as a codeword, for example.

Note that encoding is not essential. Although the memory controller 1 may store unit data in the nonvolatile memory 2 without encoding the unit data, FIG. 1 illustrates a configuration for performing encoding as a configuration example. When the memory controller 1 does not perform encoding, page data matches unit data. One codeword may be generated based on one unit data, or one codeword may be generated based on division data obtained by dividing unit data. One codeword may be generated using a plurality of unit data.

The processor 12 determines the memory region in the nonvolatile memory 2 at a writing destination for each unit data. A physical address is assigned to the memory region in the nonvolatile memory 2. The processor 12 manages the memory region at the writing destination of unit data using the physical address. The processor 12 instructs the memory interface 15 to designate the physical address assigned to the determined memory region and write user data into the nonvolatile memory 2. The processor 12 manages a correspondence between a logical address of user data (a logical address managed by the host) and the physical address. When receiving a reading request including the logical address from the host, the processor 12 specifies a physical address corresponding to the logical address, designates the physical address, and instructs the memory interface 15 to read out user data.

The ECC circuit 14 encodes user data stored in the RAM 11 to generate a codeword. The ECC circuit 14 decodes the codeword read out of the nonvolatile memory 2. The RAM 11 temporarily stores user data received from the host until the user data is stored in the nonvolatile memory 2, and temporarily stores data read out of the nonvolatile memory 2 until the data is transmitted to the host. The RAM 11 is a general-purpose memory such as an SRAM (static random access memory) or a DRAM (dynamic random access memory).

FIG. 1 illustrates an example of a configuration in which the memory controller 1 includes the ECC circuit 14 and the memory interface 15. However, the ECC circuit 14 may be contained in the memory interface 15. The ECC circuit 14 may be contained in the nonvolatile memory 2.

When receiving a writing request from the host, the memory controller 1 operates as follows. The processor 12 temporarily stores write data in the RAM 11. The processor 12 reads out the data stored in the RAM 11, and inputs the read data into the ECC circuit 14. The ECC circuit 14 encodes the inputted data, and inputs a codeword into the memory interface 15. The memory interface 15 writes the inputted codeword into the nonvolatile memory 2.

When receiving a reading request from the host, the memory controller 1 operates as follows. The memory interface 15 inputs the codeword read out of the nonvolatile memory 2 into the ECC circuit 14. The ECC circuit 14 decodes the inputted codeword, and stores data obtained by the decoding in the RAM 11. The processor 12 transmits the data stored in the RAM 11 to the host via the host interface 13.

Figure 2:
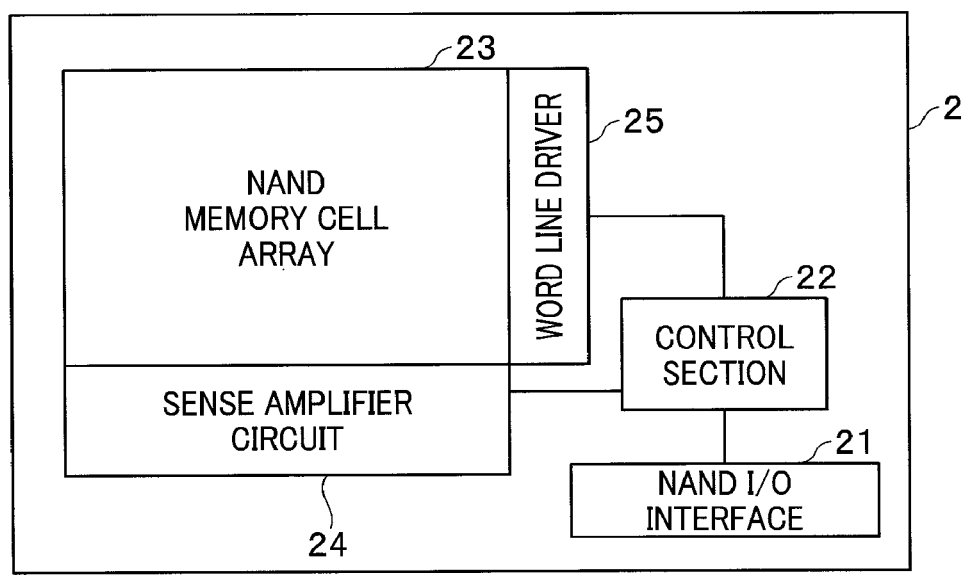
FIG. 2 is a block diagram illustrating an example of a configuration of a nonvolatile memory according to the embodiment.

FIG. 2 is a block diagram illustrating an example of a configuration of the nonvolatile memory according to the embodiment. The nonvolatile memory 2 includes a NAND I/O interface 21, a control section 22, a NAND memory cell array 23, a sense amplifier circuit 24, and a word line driver 25. The nonvolatile memory 2 is composed of a one-chip semiconductor substrate (e.g., a silicon substrate), for example.

The NAND I/O interface 21 receives control signals such as a write enable signal WEn, a read enable signal REn, an address latch enable signal ALE, or a command latch enable signal CLE outputted from the memory controller 1. The NAND I/O interface 21 receives a command, an address, and data outputted from the memory controller 1.

The control section (control circuit) 22 receives the control signal, the command, the address, and the data from the NAND I/O interface 21, and controls an operation of the nonvolatile memory 2 based on the received control signal, command, address, and data. The control section 22 controls the word line driver 25 and the sense amplifier circuit 24 based on the control signal, the command, the address, and the data, for example, and performs a writing operation, a reading operation, an erasing operation, and the like.

When receiving a write command, the control section 22 controls the sense amplifier circuit 24 and the word line driver 25 to write data inputted at the write command into a designated address on the NAND memory cell array 23. When receiving a read command, the control section 22 controls the sense amplifier circuit 24 and the word line driver 25 to read out data from the designated address on the NAND memory cell array 23.

For example, the control section 22 controls a voltage to be applied to a plurality of word lines WL by the word line driver 25 and a voltage (bit line voltage) to be applied to a plurality of bit lines BL by the sense amplifier circuit 24 to write data into memory cells (memory cell transistors) MT included in the NAND memory cell array 23.

The sense amplifier circuit 24 is configured such that data in each of the memory cells MT can be detected by independently applying a voltage (or a current) to the plurality of bit lines BL and independently detecting the voltage (or the current) on the plurality of bit lines BL. In other words, the sense amplifier circuit 24 includes a plurality of sense amplifier units SAU configured to each detect data in the plurality of memory cells MT via the plurality of bit lines BL while applying the bit line voltage to the plurality of bit lines BL.

The word line driver 25 is configured such that various types of voltages such as a program voltage can be applied independently to the plurality of word lines and select gate lines. In other words, the word line driver 25 can apply a program voltage to the plurality of word lines.

(Configuration of NAND Memory Cell Array)

Figure 3:
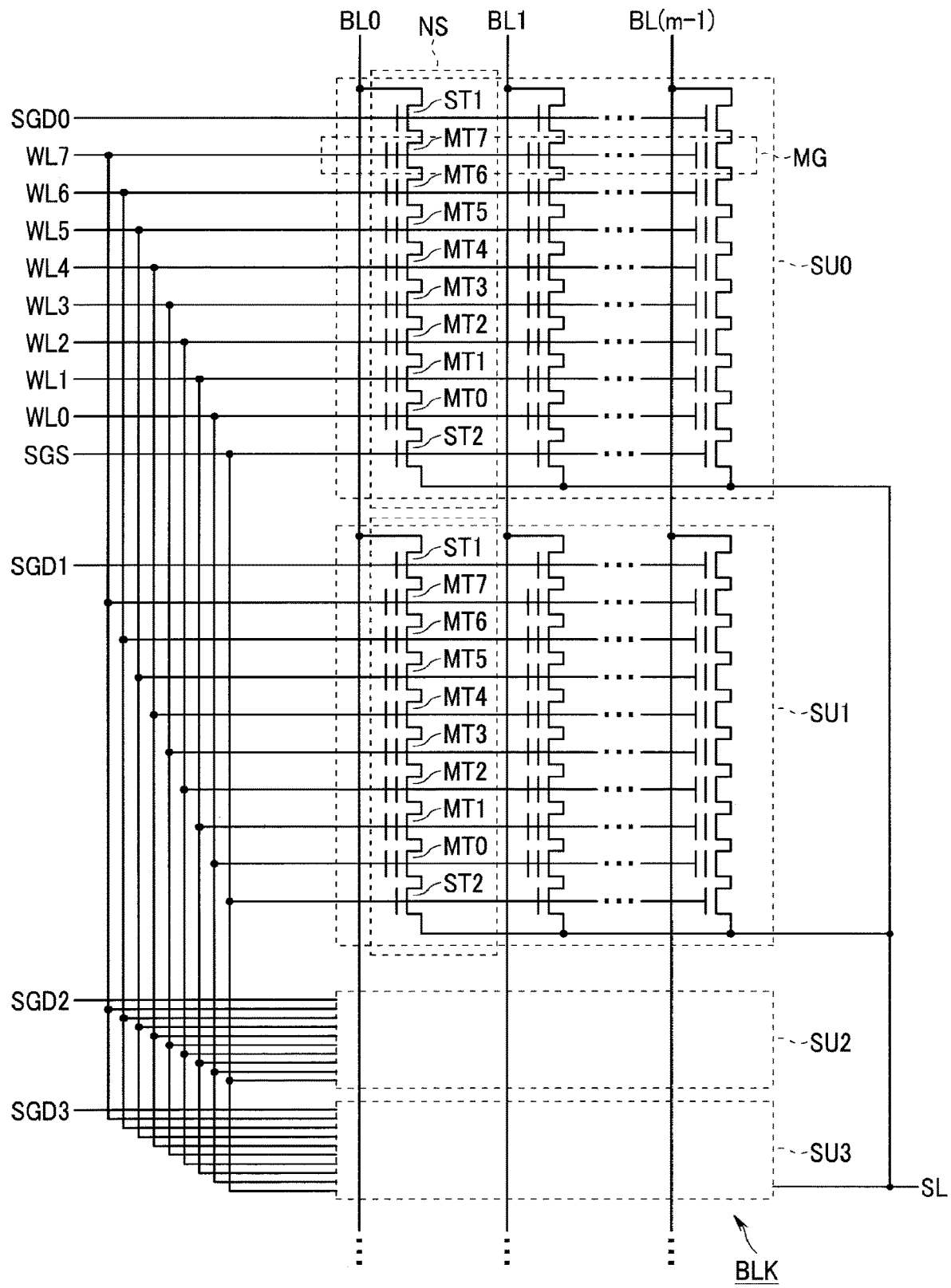
FIG. 3 is a diagram illustrating an example of a configuration of a block in a NAND memory cell array having a three-dimensional structure according to the embodiment.

FIG. 3 is a diagram illustrating an example of a configuration of a block in the NAND memory cell array 23 having a three-dimensional structure. FIG. 3 illustrates one block BLK among a plurality of blocks constituting the NAND memory cell array (hereinafter referred to as "memory cell array") 23 having a three-dimensional structure. The other block in the memory cell array has a similar configuration to the configuration illustrated in FIG. 3. The memory cell array 23 includes a plurality of memory cells MT each settable to any one of respective threshold voltages at a plurality of levels, as described below. In other words, the memory cell array 23 includes a plurality of memory cells MT each settable to any one of respective threshold voltages at a plurality of levels.

The block BLK includes four string units (SU0 to SU3), for example, as illustrated. Each of the string units SU includes a plurality of NAND strings NS. Each of the NAND strings NS includes eight memory cells MT (MT0 to MT7) and selection transistors ST1 and ST2. Note that although the number of memory cells MT included in the NAND string NS is eight here, the number of memory cells MT is not limited to eight, but may be 32, 48, 64, or 96, for example. The selection transistors ST1 and ST2 may be the same as a memory cell transistor in terms of structure, although illustrated as one transistor in terms of electrical circuit. To enhance a cutoff characteristic, for example, a plurality of selection transistors may be used as each of the selection transistors ST1 and ST2. Further, dummy cell transistors may be respectively provided between the memory cells MT and the selection transistors ST1 and ST2.

The memory cells MT are arranged to be connected in series between the selection transistors ST1 and ST2. The memory cell MT7 on one end side is connected to the selection transistor ST1, and the memory cell MT0 on the other end side is connected to the selection transistor ST2.

Respective gates of the selection transistors ST1 in the string units SU0 to SU3 are respectively connected to select gate lines SGD0 to SGD3. On the other hand, respective gates of the selection transistors ST2 in the string units SU0 to SU3 are connected to a select gate line SGS which is common among the plurality of string units SU within the same block BLK. Respective gates of the memory cell MT0 to MT7, the memory cells MT0 to MT7, . . . in the string units SU0 to SU3 within the same block BLK are connected to word lines WL0 to WL7 which are common among the plurality of string units SU. In other words, the word lines WL0 to WL7 and the select gate line SGS are commonly connected among the plurality of string units SU0 to SU3 within the same block BLK, while the select gate lines SGD are independent for the string units SU0 to SU3 even within the same block BLK.

The word lines WL0 to WL7 are respectively connected to the gates of the memory cells MT0 to MT7 constituting each of the NAND strings NS. In other words, each of the plurality of word lines WL is connected to the gates of the plurality of corresponding memory cells MT. The gates of the memory cells MTi in the same row within the block BLK are connected to the same word line WLi.

Each of the NAND strings NS is connected to the corresponding bit line BL. Therefore, each of the memory cells MT included in each of the NAND strings NS is connected to the bit line BL via the selection transistors ST and the other memory cells MT in the NAND string NS. The plurality of bit lines BL are respectively connected to one ends of the plurality of NAND strings NS each including the plurality of memory cells MT.

As described above, respective data in the memory cells MT within the same block BLK are collectively erased. On the other hand, the data are read out and written in a memory cell groups MG unit (or a page unit). In the present specification, the plurality of memory cells MT connected to the one word line WLi and belonging to the one string unit SU are defined as a memory cell group MG. In the present embodiment, the nonvolatile memory 2 is a TLC (triple level cell) NAND memory capable of holding data composed of three bits (eight values). Therefore, the one memory cell group MG can hold data corresponding to three pages. Three bits which can be held by each of the memory cells MT respectively correspond to the three pages.

Figure 4:
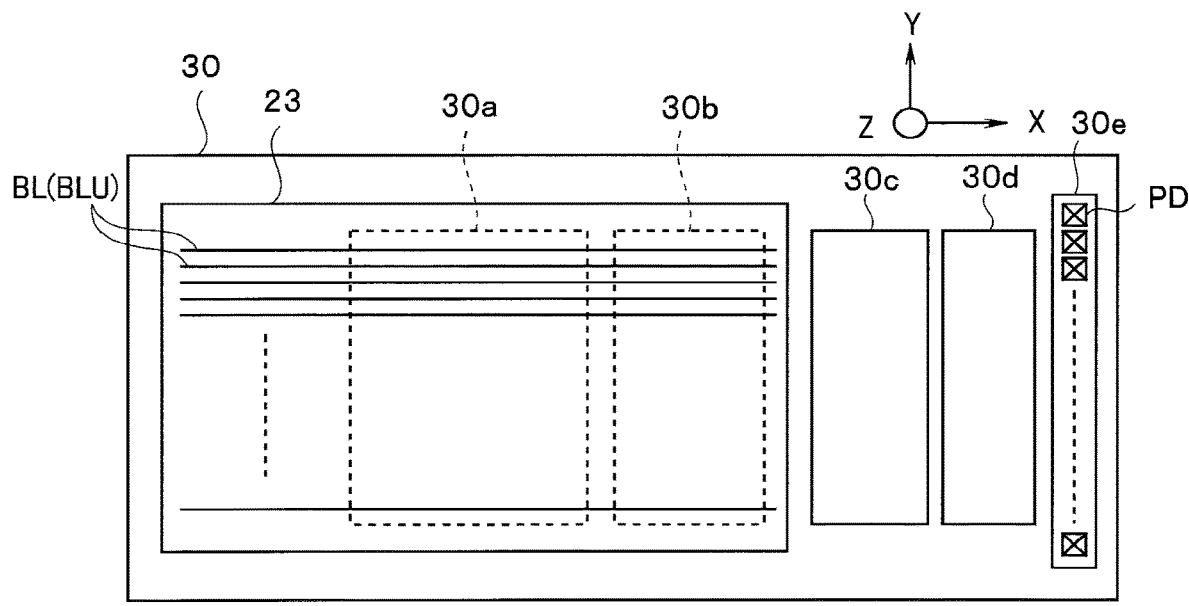
FIG. 4 is a planar layout diagram of a semiconductor chip in which the nonvolatile memory according to the embodiment is formed.

FIG. 4 is a planar layout diagram of a semiconductor chip in which the nonvolatile memory 2 according to the present embodiment is faulted. As illustrated in FIG. 4, peripheral circuits around the memory cell array 23 are loaded on the semiconductor substrate 30. FIG. 4 illustrates a sense amplifier region 30a where a plurality of hookup circuits BLHU and a plurality of sense amplifier units SAU in the sense amplifier circuit 24 are arranged and a data latch region 30b where a plurality of latch circuits XDL in the sense amplifier circuit 24 are arranged. The sense amplifier region 30a and the data latch region 30b are disposed side by side in an X-direction below the three-dimensional NAND memory cell array 23 in a Z-direction. The plurality of bit lines BL (upper bit lines BLU) close to the NAND memory cell array 23 are formed to extend in the X-direction. A portion arranged above the NAND memory cell array 23 in each of the bit lines BL is referred to as the upper bit line BLU, and a portion arranged below (on a side closer to the semiconductor substrate 30 than) the NAND memory cell array 23 is referred to as a lower bit line BLL.

Further, a control circuit region 30c provided with the control section 22, an input/output buffer region 30d provided with an input/output buffer included in the NAND I/O interface 21, and an input/output pad region 30e provided with input/output pad groups PD are arranged on the semiconductor substrate 30. The input/output pad groups PD are arranged on one side of the semiconductor chip, and are arranged along one side of the semiconductor chip (in a Y-direction).

Figure 5A:
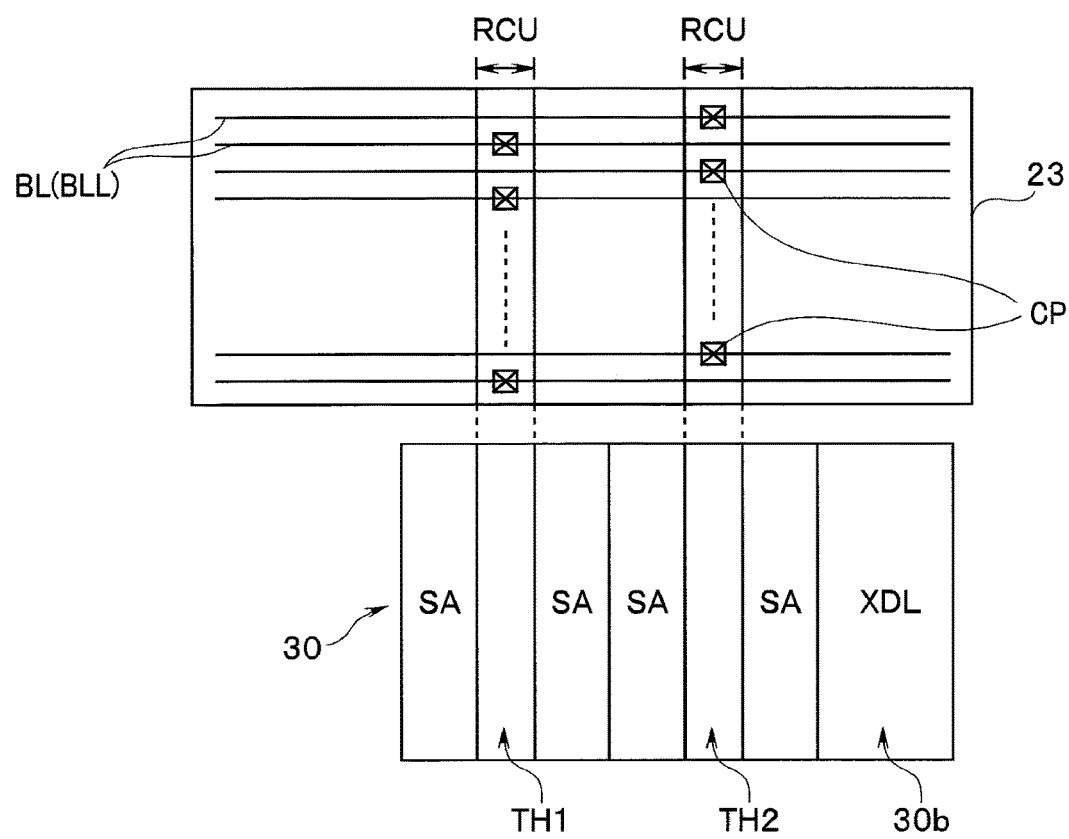
FIG. 5A is a schematic plan view for describing a connection relationship between the NAND memory cell array and a sense amplifier circuit provided under the NAND memory cell array according to the embodiment.

FIG. 5A is a schematic plan view for describing a connection relationship between the NAND memory cell array 23 and the sense amplifier circuit 24 provided under the NAND memory cell array 23. An upper side of FIG. 5A is a plan view of the NAND memory cell array 23. A lower side of FIG. 5A is a plan view representing a layout of the peripheral circuits such as the sense amplifier circuit 24 provided under the NAND memory cell array 23 in the Z-direction.

Figure 5B:
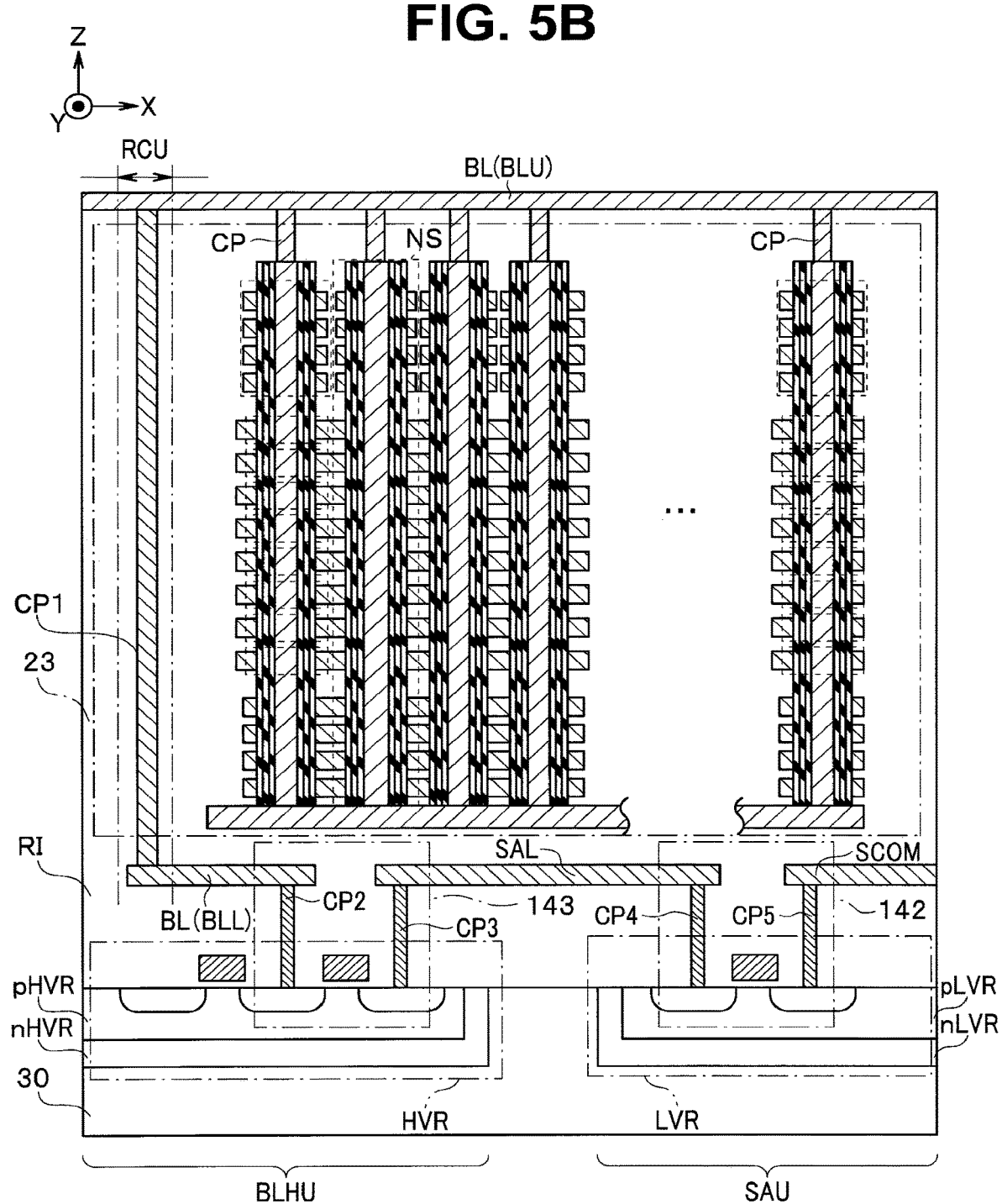
FIG. 5B is a cross-sectional view in a Z-direction of the nonvolatile memory according to the embodiment.

FIG. 5B is a cross-sectional view in the Z-direction of the nonvolatile memory 2. FIG. 5B illustrates part of transistors in the hookup circuit BLHU and the sense amplifier unit SAU connected to each of the bit lines BL. As illustrated in FIG. 5B, a well region HVR for a high withstand voltage transistor and a well region LVR for a low withstand voltage transistor are provided on the semiconductor substrate 30. The well region HVR includes an n-type well nHVR and a p-type well pHVR. The well region LVR includes an n-type well nLVR and a p-type well pLVR.

A high withstand voltage n-channel MOS transistor 143, described below, is formed in the well region HVR, and a low withstand voltage n-channel MOS transistor 142, described below, for example, is formed in the well region LVR.

The bit line BL includes the upper bit line BLU arranged above the memory cell array 23 and the lower bit line BLL arranged below the memory cell array 23. The upper bit line BLU is connected to the lower bit line BLL within an interlayer insulating film RI via a contact plug CP1. The lower bit line BLL is connected to the high withstand voltage n-channel MOS transistor 143 via a contact plug CP2. The high withstand voltage n-channel MOS transistor 143 is further connected to a sense amplifier line SAL via a contact plug CP3. The sense amplifier line SAL is connected to the low withstand voltage n-channel MOS transistor 142, described below, via a contact plug CP4. The low withstand voltage n-channel MOS transistor 142 is further connected to a node SCOM, described below, via a contact plug CP5. The lower bit line BLL, the sense amplifier line SAL, and the node SCOM are disposed within a wiring layer region between the semiconductor substrate 30 and the memory cell array 23.

As illustrated in FIGS. 5A and 5B, the plurality of upper bit lines BLU are formed above the NAND memory cell array 23. Further, two connection regions RCU for electrical connection with the plurality of upper bit lines BLU are provided in the NAND memory cell array 23. A plurality of contact plugs CP formed in the Z-direction for electrical connection with the upper bit lines BLU are formed in each of the connection regions RCU. The two connection regions RCU are disposed in the X-direction away from each other.

The sense amplifier region 30a on the semiconductor substrate 30 includes a plurality of (here, four) sub-regions SA and a plurality of (here, two) tap hookup regions TH1 and TH2. Each of the sub-regions SA includes a plurality of sense amplifier units SAU. Each of the tap hookup regions TH1 and TH2 includes a plurality of connection portions for connection in an upward or downward direction as the Z-direction and a plurality of hookup circuits.

The tap hookup region TH1 is associated with a plurality of odd-numbered lower bit lines among the lower bit lines BLL respectively constituting portions of the bit lines BL, and the tap hookup region TH2 is associated with a plurality of even-numbered lower bit lines among the lower bit lines BLL respectively constituting portions of the bit lines BL.

Each of the odd-numbered bit lines among the plurality of bit lines BL from a wiring layer region WR is connected to the corresponding connection portion (i.e., tap portion) in the tap hookup region TH1. Each of the even-numbered bit lines among the bit lines BL from the wiring layer region WR is connected to a corresponding connection portion (i.e. tap portion) in the tap hookup region TH2.

A signal on each of the bit lines BL in the tap hookup region TH1 is fed via the corresponding hookup circuit to the sub-regions SA on both sides of the tap hookup region TH1 through a wiring pattern (not illustrated). For example, signals on the odd-numbered bit lines BL1, BL5, BL9, . . . are fed to one of the sub-regions SA on both sides of the tap hookup region TH1, and signals on the odd-numbered bit lines BL3, BL7, BL11, . . . are fed to the other sub-region SA.

Similarly, a signal on each of the bit lines BL in the tap hookup region TH2 is fed via the corresponding hookup circuit to the sub-regions SA on both sides of the tap hookup region TH2 through a wiring pattern (not illustrated). For example, signals on the even-numbered bit lines BL0, BL4, BL8, . . . are fed to one of the sub-regions SA on both sides of the tap hookup region TH2, and signals on the even-numbered bit lines BL2, BL6, BL10, . . . are fed to the other sub-region SA.

The latch circuits XDL, described below, within the data latch region 30b are respectively connected to the sense amplifier units SAU via buses DBUS. Therefore, a signal on the HV-type bit line BL is inputted to the tap hookup regions TH1 and TH2, and a plurality of wiring patterns for the plurality of LV-type buses DBUS which respectively connect the plurality of latch circuits XDL in the data latch region 30b and the sense amplifier units SAU in each of the sub-regions SA to each other are disposed in a wiring layer above the tap hookup regions TH1 and TH2. Part of the plurality of wiring patterns formed in the wiring layer respectively constitute part of the lower bit lines BLL, and another part of the plurality of wiring patterns respectively constitute part of the plurality of buses DBUS.

Figure 6:
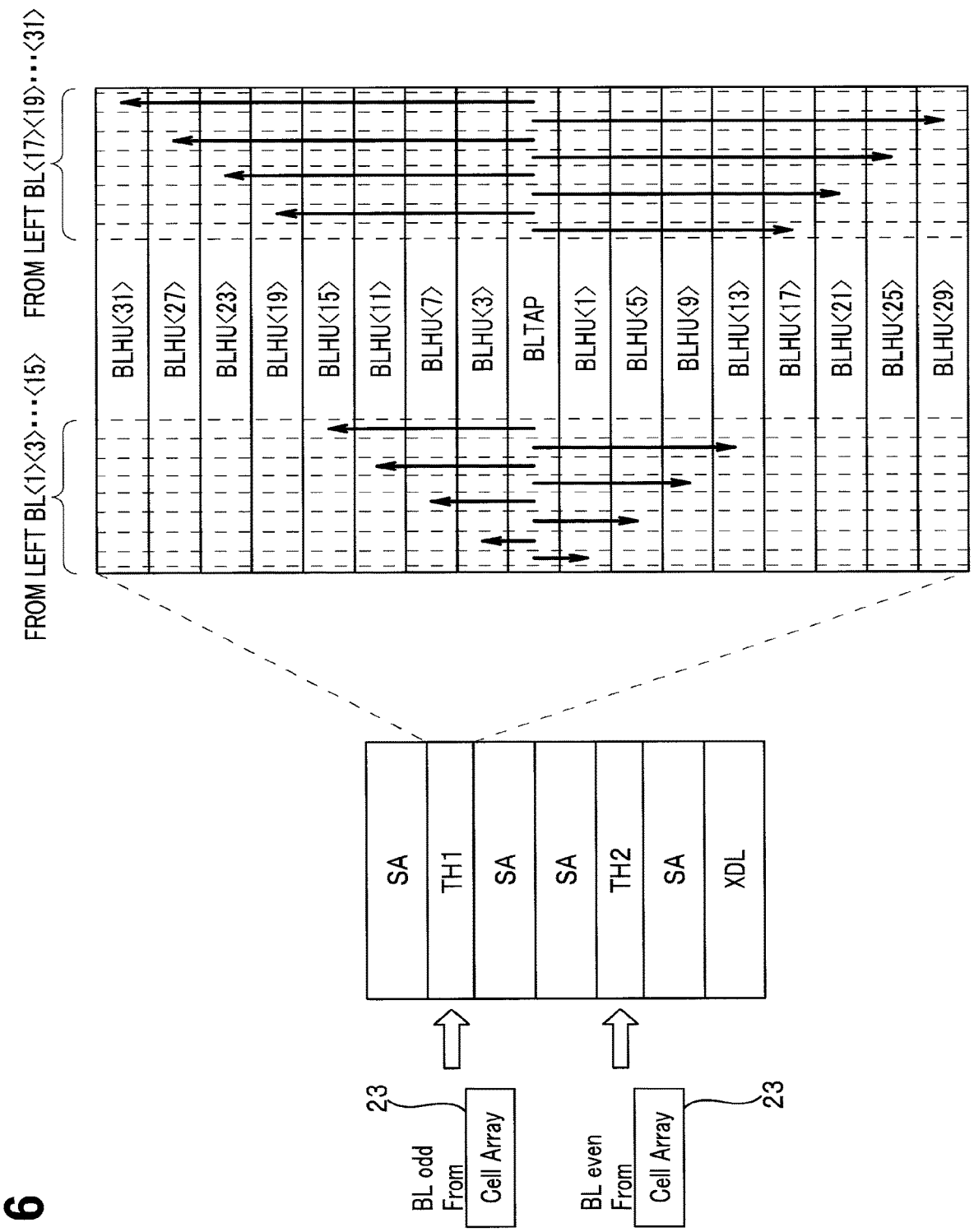
FIG. 6 is a diagram illustrating an arrangement of a plurality of connection portions and a plurality of hookup circuits in each of tap hookup regions according to the embodiment.

FIG. 6 is a diagram illustrating an arrangement of a plurality of connection portions and a plurality of hookup circuits in the tap hookup region TH1. A case where each of the tap hookup regions TH1 and TH2 includes 16 hookup circuits will be herein described.

Note that the tap hookup region TH2 has the same configuration as a configuration of the tap hookup region TH1 except that the tap hookup region TH2 handles even-numbered bit lines BL. Therefore, only the configuration of the tap hookup region TH1 is described, and description of the configuration of the tap hookup region TH2 is omitted.

The tap hookup region TH1 has a connection portion BLTAP arranged in a belt shape in its central portion. In the tap hookup region TH1, 16 hookup circuits BLHU are arranged on both sides of the connection portion BLTAP. The connection portion BLTAP includes 16 connection regions (i.e., tap regions) for electrical connection with the upper wiring pattern.

Each of the connection regions is connected to the corresponding hookup circuit BLHU. In FIG. 6, the eight connection regions in the connection portion BLTAP are respectively connected to the eight hookup circuits BLHU <1>, BLHU <5>, BLHU <9>, ... BLHU <29> on the lower side. Similarly, the other eight connection regions in the connection portion BLTAP are respectively connected to the eight hookup circuits BLHU <3>, BLHU <7>, BLHU <11>, ... BLHU <31> on the upper side.

The connection regions and the hookup circuits BLHU are respectively connected to each other via wiring patterns in one or two or more wiring layers within the wiring layer region WR. Each of the hookup circuits BLHU is connected to the corresponding sense amplifier unit SAU within the sub-region SA via a wiring (not illustrated).

Figure 7:
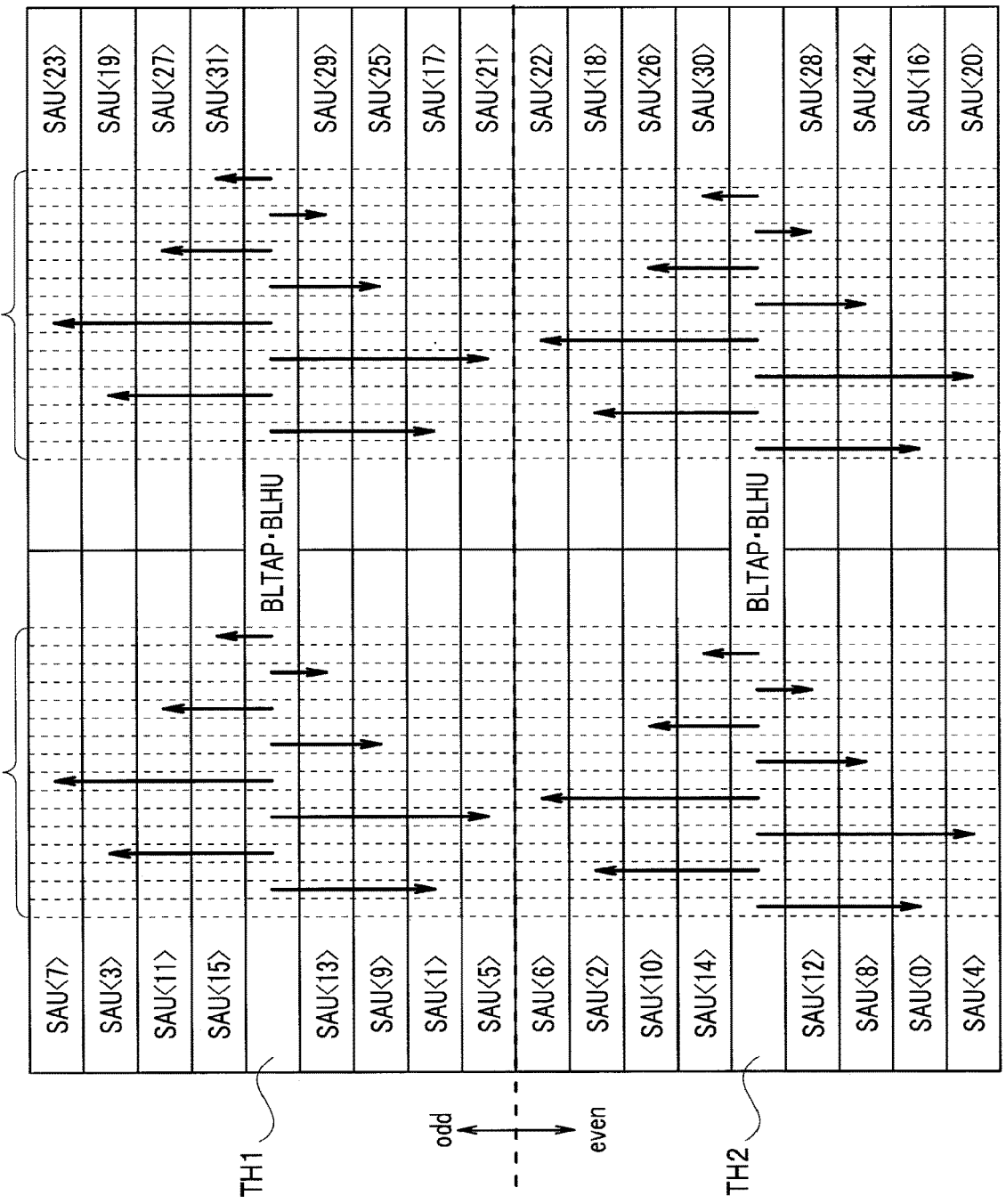
FIG. 7 is a diagram illustrating a connection relationship between each of the tap hookup regions and sense amplifier units according to the embodiment.

FIG. 7 is a diagram illustrating a connection relationship between each of the tap hookup regions TH1 and TH2 and the sense amplifier units SAU. On an upper side of FIG. 7, connections from the tap hookup region TH1 associated with the plurality of odd-numbered bit lines BL to the plurality of sense amplifier units SAU are respectively indicated by arrows. On a lower side of FIG. 7, connections from the tap hookup region TH2 associated with the plurality of even-numbered bit lines BL to the plurality of sense amplifier units SAU are respectively indicated by arrows.

Figure 8:
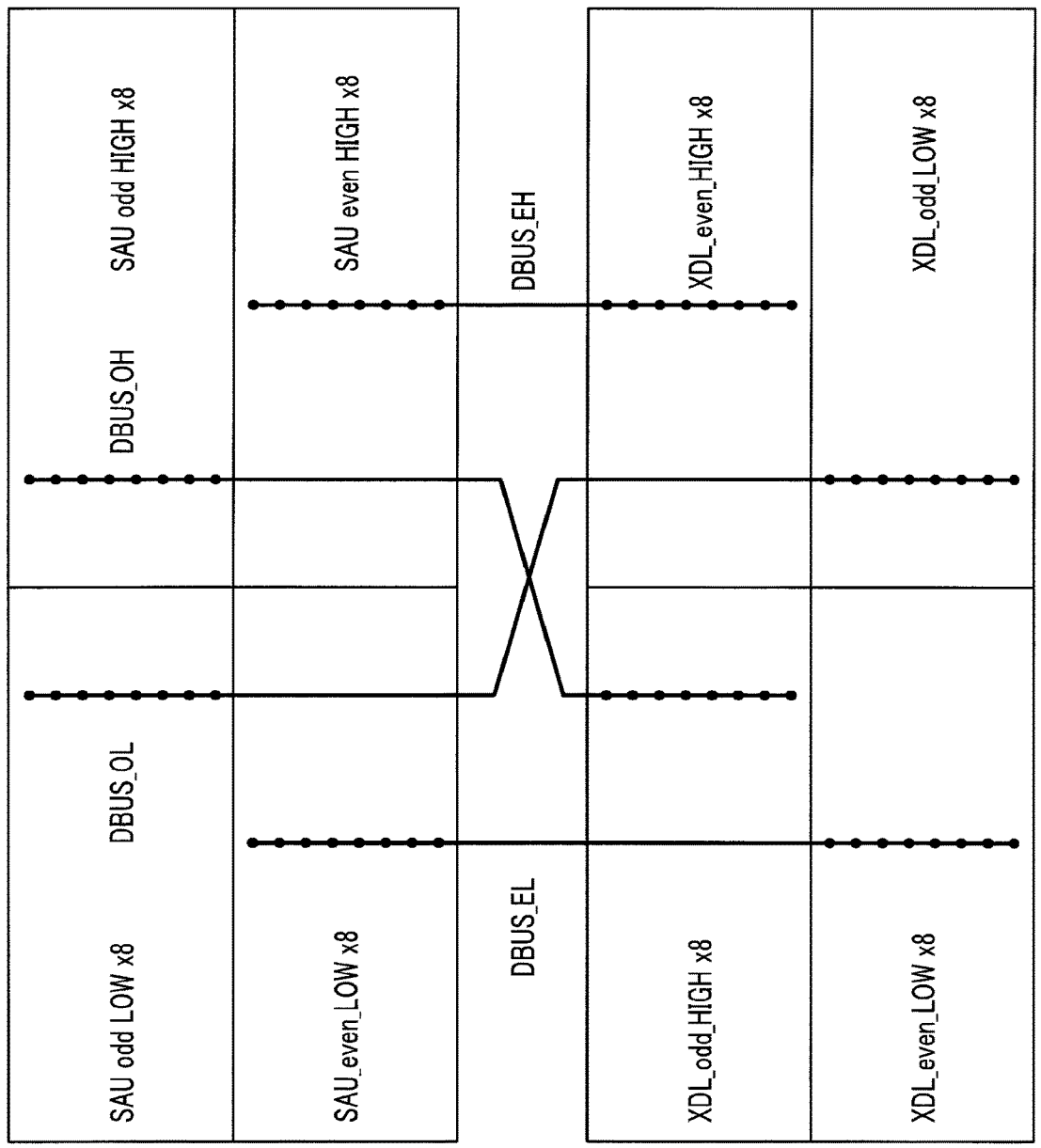
FIG. 8 is a diagram illustrating a connection relationship between the plurality of sense amplifier units and a plurality of latch circuits according to the embodiment.

FIG. 8 is a diagram illustrating a connection relationship between the plurality of sense amplifier units SAU and the plurality of latch circuits XDL. The plurality of sense amplifier units SAU associated with the plurality of odd-numbered lower bit lines BL are respectively connected to the plurality of corresponding latch circuits XDL via a bus DBUS_OL. The plurality of sense amplifier units SAU associated with the plurality of odd-numbered upper bit lines BL are respectively connected to the plurality of corresponding latch circuits XDL via a bus DBUS_OH.

The plurality of sense amplifier units SAU associated with the plurality of even-numbered lower bit lines BL are respectively connected to the plurality of corresponding latch circuits XDL via a bus DBUS_EL. The plurality of sense amplifier units SAU associated with the plurality of even-numbered upper bit lines BL are respectively connected to the plurality of corresponding latch circuits XDL via a bus DBUS_EH.

Figure 9:
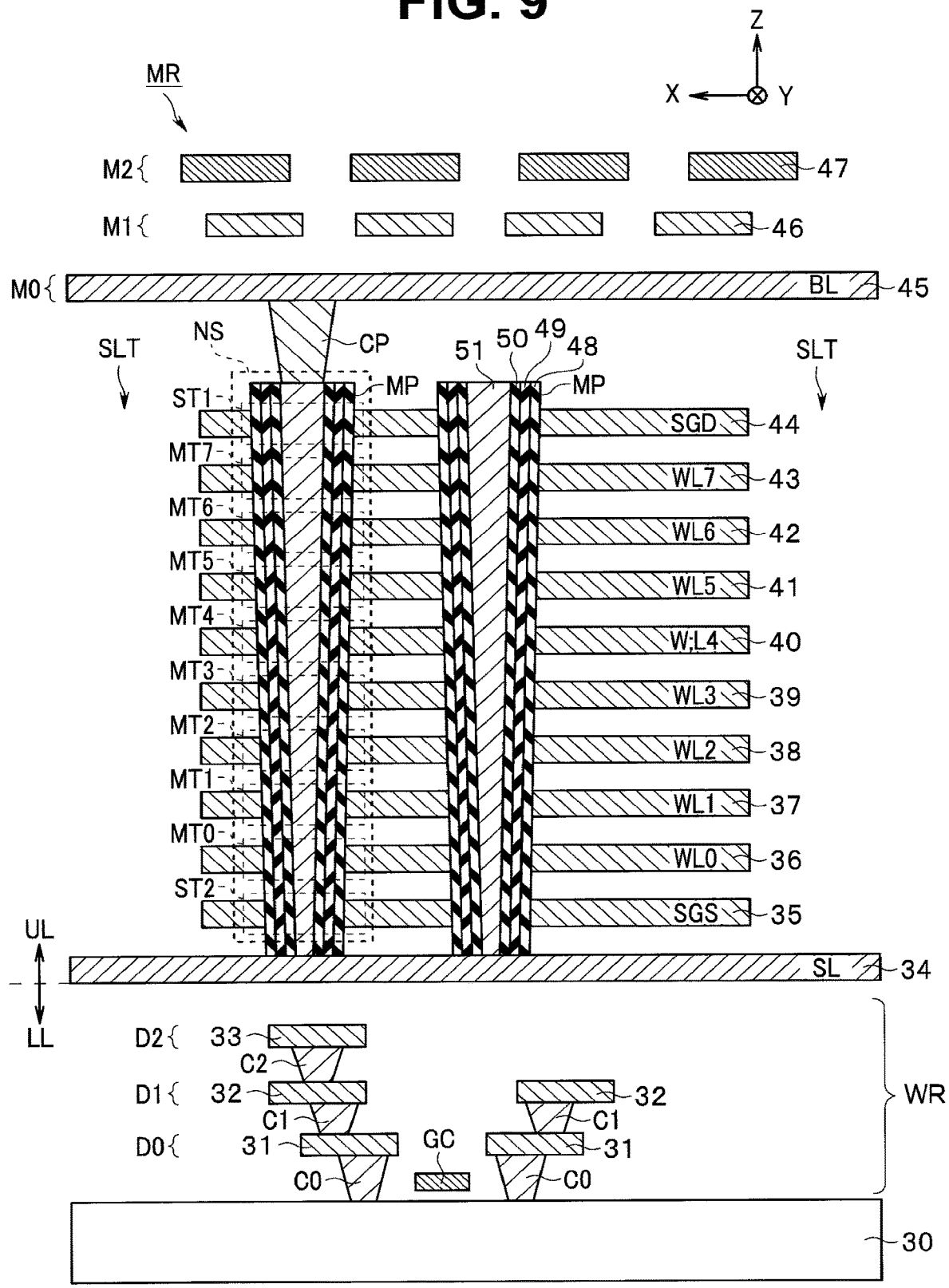
FIG. 9 is a cross-sectional view illustrating an example of a cross-sectional structure of a memory region in the NAND memory cell array included in the nonvolatile memory according to the embodiment.

FIG. 9 is a cross-sectional view illustrating an example of a cross-sectional structure of a memory region MR in the NAND memory cell array 23 included in the nonvolatile memory 2 according to the present embodiment. As illustrated in FIG. 9, the nonvolatile memory 2 in the memory region MR includes the semiconductor substrate 30, conductors 31 to 47, memory pillars MP, and contacts C0, C1, C2, and CP. Note that in the drawings described below, respective illustrations of a p-type or N-type well region formed in an upper surface portion of the semiconductor substrate 30, an impurity diffusion region formed within each of the well regions, and a device isolation region for insulating the well regions are omitted.

In the memory region MR, the plurality of contacts C0, for example, are provided on the semiconductor substrate 30. The plurality of contacts C0 are connected to an impurity diffusion region (not illustrated) provided in the semiconductor substrate 30. The NAND memory cell array 23 is arranged on the semiconductor substrate 30 via the wiring layer region WR.

The conductor 31 for which wiring patterns are formed is provided on each of the contacts C0. Part of the plurality of wiring patterns for the conductor 31 are respectively part of the bit lines BL, described above, and part of the buses DBUS to the latch circuits XDL, described below. Another part of the plurality of wiring patterns are respectively wirings of part of various types of transistors. In the case, a gate electrode GC is provided in the vicinity of a region between the adjacent conductors 31. In this case, one of the adjacent conductors 31 is connected to a drain of the transistor, and the other conductor 31 is connected to a source of the transistor.

The contact C1, for example, is provided on each of the conductors 31. The conductor 32, for example, is provided on each of the contacts C1. The contact C2, for example, is provided on the conductor 32. The conductor 33, for example, is provided on the contact C2.

As described above, wiring patterns for each of the conductors 31, 32, and 33 are disposed in the wiring layer region WR between the sense amplifier circuit 24 and the NAND memory cell array 23. Wiring layers provided with the conductors 31, 32, and 33 are respectively referred to as wiring layers D0, D1, and D2. The wiring layers D0, D1, and D2 are provided in a lower layer portion of the nonvolatile memory 2. Note that although the wiring layer region WR is provided with the three wiring layers, the wiring layer region WR may be provided with two or less wiring layers, or four or more wiring layers.

A conductor 34 is provided above the conductor 33 via an interlayer insulating film, for example. The conductor 34 is a source line SL formed in a plate shape parallel to an XY plane, for example. Conductors 35 to 44 are stacked in this order, for example, to correspond to each of the string units SU above the conductor 34. An interlayer insulating film (not illustrated) is provided between the conductors adjacent to each other in the Z-direction among the conductors.

A structure corresponding to the one string unit SU is provided between adjacent slits SLT. The slits SLT spread in the Y-direction and the Z-direction, for example, and insulate the conductors 35 to 44 and the conductors 35 to 44 respectively provided in the adjacent string units SU (not illustrated).

Each of the conductors 35 to 44 is formed in a plate shape parallel to the XY plane, for example. For example, the conductor 35 corresponds to a select gate line SGS, the conductors 36 to 43 respectively correspond to word lines WL0 to WL7, and the conductor 44 corresponds to a select gate line SGD.

Each of the memory pillars MP is provided in a pillar shape penetrating the conductors 35 to 44, and contacts the conductor 34. Each of the memory pillars MP includes a block insulating film 48, a charge storage film 49, a tunnel oxide film 50, and a semiconductor material 51, for example.

The block insulating film 48 is provided on an inner wall of a memory hole formed by a manufacturing process of the nonvolatile memory 2. The charge storage film 49 is provided on an inner wall of the block insulating film 48. The charge storage film 49 functions as a charge storage layer of the memory cell transistor MT. The tunnel oxide film 50 is provided on an inner wall of the charge storage film 49. The semiconductor material 51 is provided on an inner wall of the tunnel oxide film 50. The semiconductor material 51 includes a conductive material and functions as a current path of the NAND string NS. A different material may be further formed on an inner wall of the semiconductor material 51.

For example, a portion where the memory pillar MP and the conductor 35 intersect each other functions as a selection transistor ST2. A portion where the memory pillar MP and each of the conductors 35 to 44 intersect each other functions as the memory cell transistor (memory cell) MT. A portion where the memory pillar MP and the conductor 44 intersect each other functions as a selection transistor ST1.

A conductor 45 is provided in a layer above an upper surface of the memory pillar MP via an interlayer insulating film. The conductor 45 is formed in a line shape extending in the X-direction, and corresponds to the bit line BL. The plurality of conductors 45 are arranged away from one another in the Y-direction (not illustrated). The conductor 45 is electrically connected to the corresponding memory pillar MP for each of the string units SU.

More specifically, in each of the string units SU, a contact plug CP is provided on the semiconductor material 51 in each of the memory pillars MP, for example, and the one conductor 45 is provided on the contact plug CP. Note that such a configuration is not a limitation but the memory pillar MP and the conductor 45 may be connected to each other via a plurality of contacts and wirings, for example.

A conductor 46 is provided in a layer above a layer provided with the conductor 45 via an interlayer insulating film. A conductor 47 is provided in a layer above a layer provided with the conductor 46 via an interlayer insulating film.

The conductors 46 and 47 respectively correspond to wirings for connecting a wiring provided in the memory cell array 23, for example, and a peripheral circuit provided under the memory cell array 23. The conductors 46 and 47 may be connected to each other by a pillar-shaped contact (not illustrated). The layer provided with the conductor 45 is referred to as a wiring layer M0, the layer provided with the conductor 46 is referred to as a wiring layer M1, and the layer provided with the conductor 47 is referred to as a wiring layer M2.

According to the above-described configuration, a region where a plurality of wiring patterns for the HV-type lower bit lines BLL and a plurality of wiring patterns for the LV-type buses DBUS exist as a mixture in one or two or more wiring layers within the wiring layer region WR above each of the tap hookup regions TH1 and TH2, as illustrated in FIGS. 5A and 5B.

(Data Writing Operation)

A data writing operation according to the present embodiment will be simply described below. First, the writing operation broadly includes a program operation and a verifying operation.

The program operation is an operation for raising a threshold voltage by injecting electrons into the charge storage film 49 (or inhibiting the injection to maintain a threshold value). An operation for raising a threshold voltage is referred to as a "0" program or "0" writing, and "0" data is fed to the bit line BL as a "0" program target. On the other hand, an operation for maintaining a threshold voltage is referred to as a "1" program, "1" writing, or "write inhibition", and "1" data is fed to the bit line BL as a "1" program target.

The verifying operation is an operation for reading out data to judge whether or not a threshold voltage of the memory cell (memory cell transistor) MT has reached a target level after the program operation. Data is then inhibited from being written into the memory cell MT which has reached the target level.

When a combination of the program operation and the verifying operation, described above, is repeated, the threshold value of the memory cell MT is raised to the target level.

Figure 10:
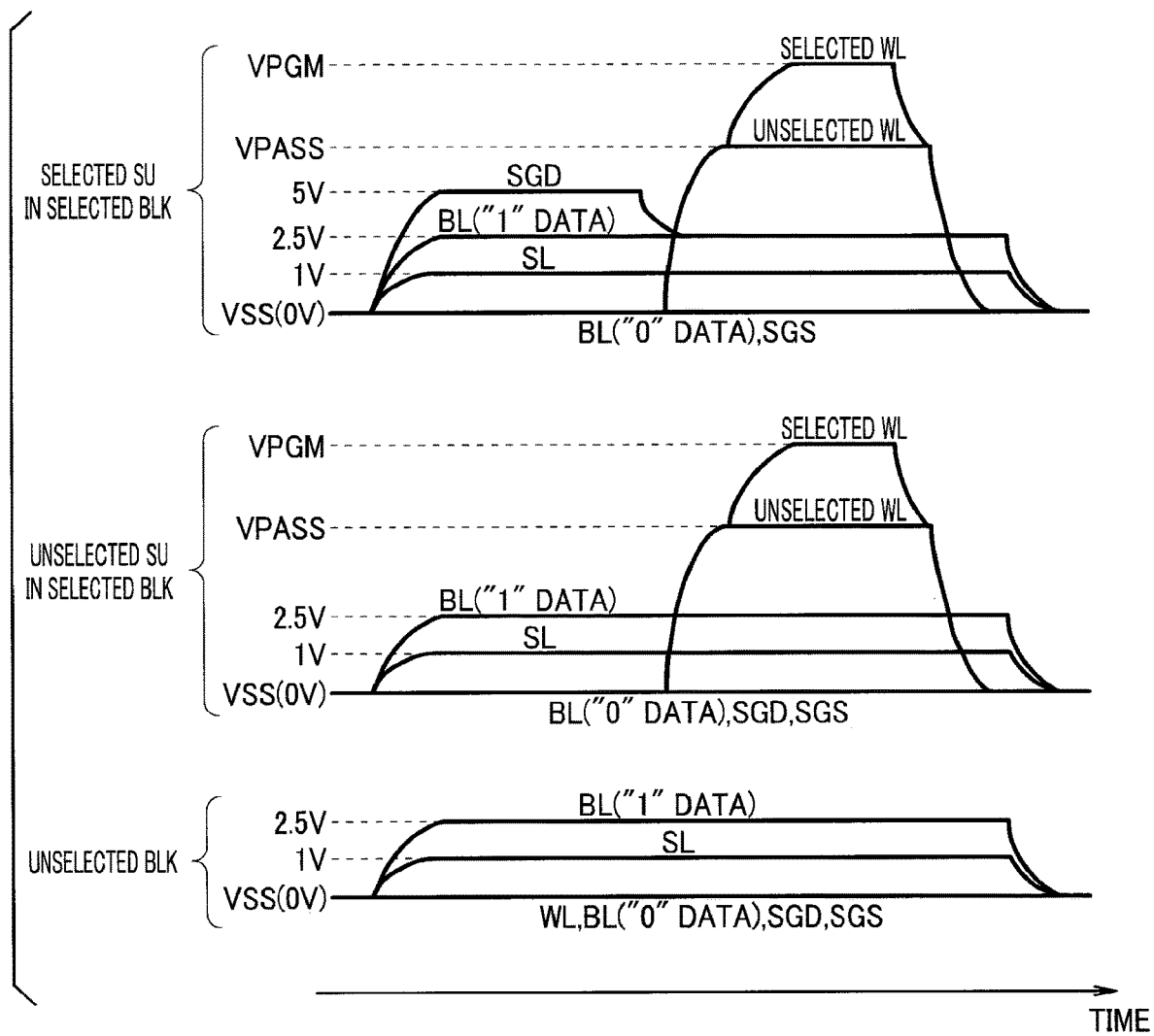
FIG. 10 is a diagram illustrating a potential change of each of wirings at the time of a writing operation according to the embodiment.

FIG. 10 is a diagram illustrating a potential change of each of wirings at the time of the writing operation. FIG. 10 illustrates the potential change of each of the wirings at the time of the program operation. As illustrated, the sense amplifier circuit 24 first transfers program data to each of the bit lines BL. A ground voltage VSS (e.g., 0 volt) is applied as an "L" level to the bit line BL to which the "0" data has been fed. A write inhibition voltage Vinhibit (e.g., 2.5 volts) is applied as an "H" level to the bit line BL to which the "1" data has been fed.

The word line driver 25 selects any one of the blocks BLK, and further selects any one of the string units SU. The word line driver 25 applies 5 volts, for example, to the select gate line SGD in the selected string unit SU, to turn on the selection transistor ST1. On the other hand, the word line driver 25 applies the voltage VSS to the select gate line SGS, to turn off the selection transistor ST2.

Further, the word line driver 25 applies the voltage VSS to the select gate lines SGD and SGS in each of the unselected string unit SU in the selected block BLK and in the unselected block BLK, to turn off the selection transistors ST1 and ST2. The source line SL is set to 1 volt (a potential higher than a potential on the select gate line SGS), for example.

Then, the word line driver 25 sets a potential on the select gate line SGD in the selected string unit SU in the selected block BLK to 2.5 volts, for example. The potential is a voltage at which the selection transistor ST1 corresponding to the bit line BL to which "0" data (0 volt) has been fed is turned on while turning off the selection transistor ST1 corresponding to the bit line BL to which "1" data (2.5 volts) has been fed.

The word line driver 25 selects any one of the word lines WL in the selected block BLK, to apply a voltage Vpgm to the selected word line and apply a voltage Vpass_pgm to the other unselected word line WE The voltage Vpgm is a high voltage for injecting electrons into the charge storage film 49 by a tunneling effect, and Vpgm>Vpass_pgm.

(Verifying Operation)

The verifying operation is an operation for verifying whether or not a threshold voltage of the selected memory cell MT has reached a verify level, i.e., whether or not desired data has been written into the selected memory cell MT. In other words, the verifying operation is a reading operation performed to verify the threshold voltage of the selected memory cell MT as a part of the writing operation.

Figure 11:
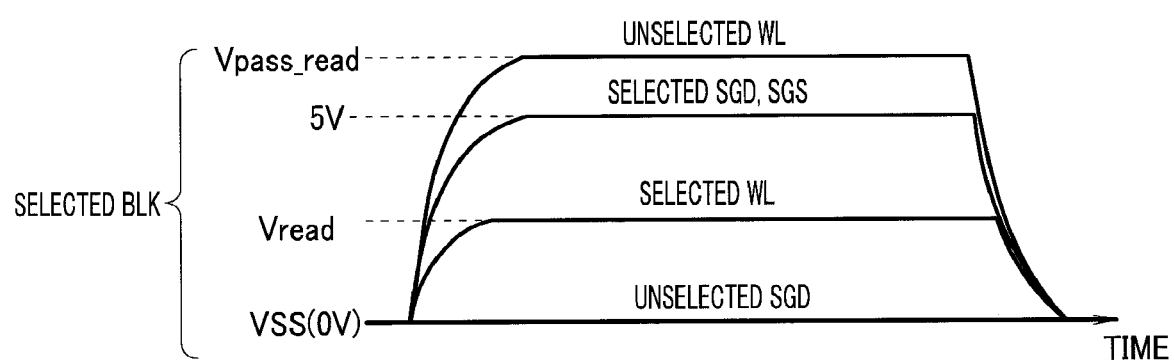
FIG. 11 is a diagram illustrating a potential change of each of wirings at the time of a verifying operation according to the embodiment.

FIG. 11 is a diagram illustrating a potential change of each of wirings at the time of the verifying operation. The word line driver 25 selects the block BLK and the string unit SU in which the program operation has been performed, and applies 5 volts, for example, to the select gate line SGS in the selected block BLK and the select gate line SGD in the selected string unit SU. As a result, in the NAND string NS included in the selected string unit SU, both the selection transistor ST1 and the selection transistor ST2 are turned on.

On the other hand, the voltage VSS is applied to the select gate line SGS in the unselected block BLK and the select gate line SGD in the unselected string unit SU in the selected block BLK, to turn off the selection transistor ST1 and/or ST2. As a result, in the NAND string NS included in the unselected string unit SU, at least the selection transistor ST1 is turned off. In the NAND string NS included in the unselected block BLK, both the selection transistor ST1 and the selection transistor ST2 are turned off.

The word line driver 25 selects any one of the word lines WL in the selected block BLK, to apply a voltage Vread to the selected word line WL and apply a voltage Vpass_read to the other unselected word lines WL. For example, when a program operation for bringing a threshold voltage of the memory cell MT into a state A has been performed, a voltage AV is used as the voltage Vread in the verifying operation. Similarly, when a program operation for bringing a threshold voltage of the memory cell MT into a state B has been performed, a voltage BV is used as the voltage Vread in the verifying operation. The voltage Vpass_read is a voltage for turning on the memory cells MT connected to the unselected word lines WL regardless of the threshold voltages of the memory cells MT, and Vpass_read>Vread (GV).

The sense amplifier circuit 24 charges each of the bit lines BL to a voltage Vb1. The voltage Vb1 is larger than a voltage Vs1 of the source line SL, and Vb1>Vs1. As a result, in the NAND string NS included in the selected string unit SU, a current flows (or does not flow) from the side of the bit line BL to the side of the source line SL depending on the threshold voltage of the memory cell MT connected to the selected word line WL. As a result, it can be verified whether or not the threshold voltage has been raised to a desired level.

As described above, the writing operation is performed by repeating a loop including the program operation and the verifying operation. In the program operation, the program voltage Vpgm is applied to the selected word line WL. In the subsequent verifying operation, at least one of the voltages AV to GV is applied to correspond to a threshold level to be verified. Note that in each loop, the verifying operation may be performed a plurality of times after the program operation has been performed. On the other hand, in each loop, the verifying operation may not be performed after the program operation has been performed.

When data is read out, a reading voltage is applied to the memory cell MT, and data, i.e., a threshold level of the memory cell MT is determined depending on whether a threshold value of the memory cell MT is lower or higher than the reading voltage.

(Sense Amplifier Circuit)

Then, the sense amplifier unit SAU in the sense amplifier circuit 24 configured to supply a bit line voltage to each of the bit lines BL while reading out data stored in the memory cell MT and performing the verifying operation will be described.

Figure 12:
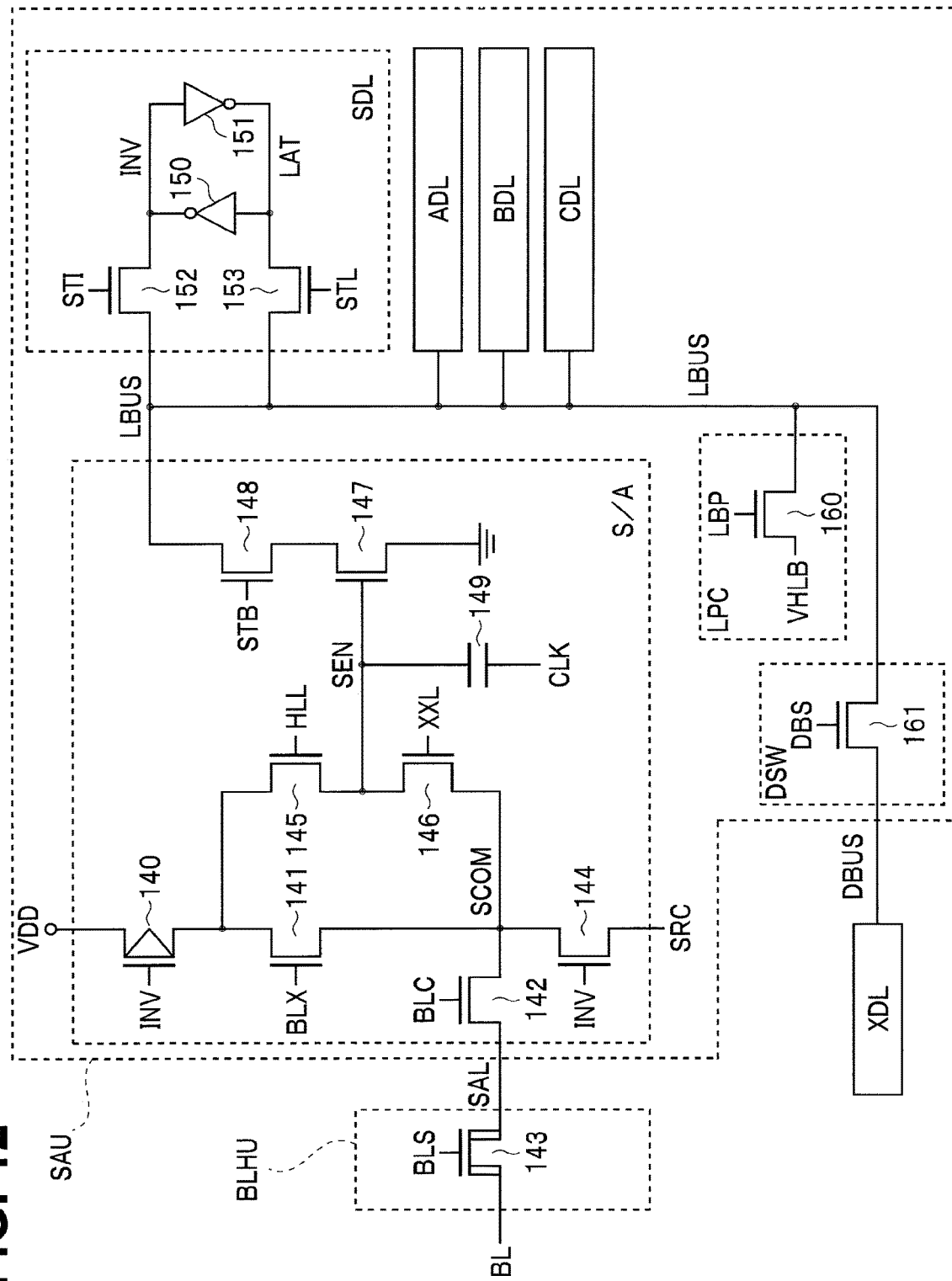
FIG. 12 is a circuit diagram illustrating an example of a specific configuration of the sense amplifier circuit according to the embodiment.

FIG. 12 is a circuit diagram illustrating an example of a specific configuration of the sense amplifier circuit 24 in FIG. 1. The sense amplifier circuit 24 includes a plurality of sense amplifier units SAU respectively associated with the bit lines BL0 to BL(m−1). FIG. 12 illustrates a specific circuit configuration of the one sense amplifier unit SAU connected to the one bit line BL.

The sense amplifier unit SAU includes a sense amplifier section S/A, latch circuits SDL, ADL, BDL, and CDL, a precharge circuit LPC, and a DBUS switch DSW, as illustrated in FIG. 12. The sense amplifier unit SAU is connected to the bit line BL via the hookup circuit BLHU. The sense amplifier section S/A and the latch circuits SDL, ADL, BDL, and CDL are connected to each other via a bus LBUS to be able to mutually receive data. The bus LBUS is connected to the bus DBUS via the DBUS switch circuit DSW, and the latch circuit XDL is connected to the bus DBUS. In other words, the sense amplifier unit SAU is connected to the latch circuit XDL via the bus DBUS. The latch circuits SDL, ADL, BDL, CDL, and XDL temporarily hold read and write data and various types of data, described below. The latch circuit XDL is connected to the control section 22 via the bus DBUS, and is used for inputting and outputting data between the sense amplifier unit SAU and the control section 22. The one bus DBUS is shared among the plurality of, e.g., four sense amplifier units SAU.

The hookup circuit BLHU includes a high withstand voltage n-channel MOS transistor 143. One end of the transistor 143 is connected to the bit line BL, and the other end of the transistor 143 is connected to the sense amplifier unit SAU via the sense amplifier line SAL. A signal BLS is inputted to a gate of the transistor 143. The signal BLS is a signal for controlling electrical connection between the bit line BL and the sense amplifier unit SAU.

The sense amplifier section S/A includes low withstand voltage n-channel MOS transistors 141, 142, 144, 145, 146, and 147, a low withstand voltage p-channel MOS transistor 140, and a capacitor 149.

A signal BLC is inputted to a gate of the transistor 142. One end of the transistor 142 is connected to the other end of the transistor 143, and the other end of the transistor 142 is connected to the node SCOM. The transistor 142 clamps the corresponding bit line BL to a potential corresponding to the signal BLC.

One end of the transistor 141 is connected to the node SCOM, and the other end of the transistor 141 is connected to the other end of the transistor 140. A signal BLX is inputted to a gate of the transistor 141.

A gate of the transistor 140 is connected to a node INV in the latch circuit SDL. One end of the transistor 140 is connected to a power supply voltage VDD. A gate of the transistor 144 is connected to the node INV in the latch circuit SDL. One end of the transistor 144 is connected to the node SCOM, and the other end of the transistor 144 is connected to a node SRC. The ground voltage VSS, for example, is applied to the node SRC.

One end of the transistor 146 is connected to a node SEN, and the other end of the transistor 146 is connected to the node SCOM. A signal XXL is inputted to a gate of the transistor 146.

One end of the transistor 145 is connected to the other end of the transistor 140, and the other end of the transistor 145 is connected to the node SEN. A signal HLL is inputted to a gate of the transistor 145.

One end of a capacitor 149 is connected to the node SEN, and a clock signal CLK is inputted to the other end of the capacitor 149.

A gate of the transistor 147 is connected to the node SEN. One end of the transistor 147 is connected to the other end of the transistor 148, and the other end of the transistor 147 is grounded. The transistor 147 functions as a sense transistor configured to sense a voltage of the node SEN.

One end of the transistor 148 is connected to the bus LBUS, and the other end of the transistor 148 is connected to the one end of the transistor 147. A signal STB is inputted to a gate of the transistor 148.

The latch circuit SDL includes inverters 150 and 151 and n-channel MOS transistors 152 and 153. An input node of the inverter 150 is connected to a node LAT, and an output node of the inverter 150 is connected to the node INV. An input node of the inverter 151 is connected to the node INV, and an output node of the inverter 151 is connected to the node LAT. One end of the transistor 152 is connected to the node INV, the other end of the transistor 152 is connected to the bus LBUS, and a control signal STI is inputted to a gate of the transistor 152. One end of the transistor 153 is connected to the node LAT, the other end of the transistor 153 is connected to the bus LBUS, and a control signal STL is inputted to a gate of the transistor 153. Data to be held in the node LAT corresponds to data to be held in the latch circuit SDL, and data to be held in the node INV corresponds to inverted data of the data to be held in the node LAT.

The precharge circuit LPC precharges the bus LBUS. The precharge circuit LPC includes a low withstand voltage n-channel MOS transistor 160. A signal LBP is inputted to a gate of the transistor 160. One end of the transistor 160 is connected to the bus LBUS, and a voltage VHLB is applied to the other end of the transistor 160. The precharge circuit LPC transfers the voltage VHLB to the bus LBUS, to precharge the bus LBUS.

The DBUS switch circuit DSW connects the bus LBUS and the bus DBUS to each other. The DBUS switch circuit DSW includes a low withstand voltage n-channel MOS transistor 161. A signal DBS is inputted to a gate of the transistor 161. One end of the transistor 161 is connected to the bus LBUS, and the other end of the transistor 161 is connected to the latch circuit XDL via the bus DBUS.

The latch circuits ADL, BDL, and CDL store bit data corresponding to a target level at the time of data writing.

The latch circuit SDL includes the inverters 150 and 151 and the n-channel MOS transistors 152 and 153, for example. The input node of the inverter 150 and the output node of the inverter 151 are connected to the node LAT. The input node of the inverter 151 and the output node of the inverter 150 are connected to the node INV. The inverters 150 and 151 respectively hold the data to be held in the nodes INV and LAT. Write data from the control section 22 is fed to the node LAT. The data to be held in the node INV is inverted data of the data to be held in the node LAT.

One end of a drain/source path of the transistor 152 is connected to the node INV, and the other end of the drain/source path is connected to the bus LBUS. One end of a drain/source path of the transistor 153 is connected to the node LAT, and the other end of the drain/source path is connected to the bus LBUS. The control signal STL is inputted to the gate of the transistor 153, and the control signal STI is inputted to the gate of the transistor 152.

Note that a circuit configuration of each of the latch circuits ADL, BDL, CDL, and XDL is similar to a configuration of the latch circuit SDL, and hence description is omitted. Note that various types of control signals to be fed to the sense amplifier unit SAU are fed from the control section 22.

The sense amplifier section S/A includes the p-channel MOS transistor 140, the n-channel MOS transistors 141 to 148, and the capacitor 149, for example. The sense amplifier section S/A senses data read out onto the corresponding bit line BL at the time of a reading operation, to judge whether the read data is "0" or "1". The sense amplifier section S/A sets the corresponding bit line BL to a voltage value corresponding to the data "0" or "1" to be written in a program operation.

In the sense amplifier section S/A, the transistors 140 to 144 are associated with the program operation. A source/drain path of the transistor 140 and a drain/source path of the transistor 141 are connected in series between a power supply line which supplies the voltage VDD as an internal power supply voltage and the node SCOM. A drain/source path of the transistor 144 is connected between the node SCOM and the node SRC to which the voltage VSS as a ground voltage is supplied. A drain/source path of the transistor 142 and a drain/source path of the transistor 143 are connected in series between the node SCOM and the bit line BL.

The respective gates of the transistors 140 and 144 are connected to the node INV. Therefore, if the node LAT is at a low level (hereinafter referred to as "L") to correspond to the "0" data, the node INV is maintained at a high level (hereinafter referred to as "H"), and the transistor 140 is off and the transistor 144 is on. On the other hand, if the node LAT is "H" to correspond to the "1" data, the node INV is maintained at "L", and the transistor 140 is on and the transistor 144 is off.

At the time of the program operation, the control signals HLL and XXL to be respectively fed to the gates of the transistors 145 and 146 are "L", and the transistors 145 and 146 are off. A control signal to be fed to the transistor 141 is "H", and the transistor 141 is on. At the time of a normal program operation, the transistors 142 and 143 are rendered conductive in response to the control signals BLC and BLS. The transistor 143 is a high withstand voltage n-channel MOS transistor, and constitutes the above-described hookup circuit BLHU.

Therefore, when the "0" data is held in the node LAT, the transistor 140 is turned off and the transistor 144 is turned on so that a bit line voltage Vbl_L such as the voltage VSS (e.g., 0 volt) from the node SRC is supplied to the bit line BL. When the "1" data is held in the node LAT, the transistor 140 is turned on and the transistor 144 is turned off so that a bit line voltage Vbl_H such as 2.5 volts is supplied to the bit line BL, for example, in response to the control signals BLC and BLS to be respectively fed to the transistors 142 and 143.

All the transistors 140 to 148 and the capacitor 149 in the sense amplifier section S/A are associated with the verifying operation. A drain/source path of the transistor 145 and a drain/source path of the transistor 146 are connected in series between the drain of the transistor 140 and the node SCOM. A drain/source path of the transistor 148 and a drain/source path of the transistor 147 are connected in series between the bus LBUS and a reference potential point. A source of the transistor 145 and a drain of the transistor 146 are connected to the sense node SEN, and the sense node SEN is connected to the gate of the transistor 147. The control signals HLL and XXL, a voltage of the sense node SEN, or the control signal STB is applied to each of the gates of the transistors 145 to 148. The clock CLK is applied to the sense node SEN via the capacitor 149.

(Configuration of Wiring Layer)

A configuration of the wiring layer region WR will be described below. The plurality of wiring patterns are formed within a plane parallel to the XY plane, as described above, on each of the wiring layers in the wiring layer region WR. A plurality of wiring patterns for various types of signal lines such as the bit lines BL in the NAND memory cell array 23 and a plurality of wiring patterns for signal lines within the peripheral circuits such as the sense amplifier circuit 24 are formed in each of the wiring layers D0, D1, and D2 in the wiring layer region WR. The plurality of wiring patterns in each of the wiring layers include wiring patterns for the bit lines BL, the buses DBUS, and the like, and part of the plurality of wiring patterns respectively constitute the bit lines BL, the buses DBUS, and the like.

Figure 13:
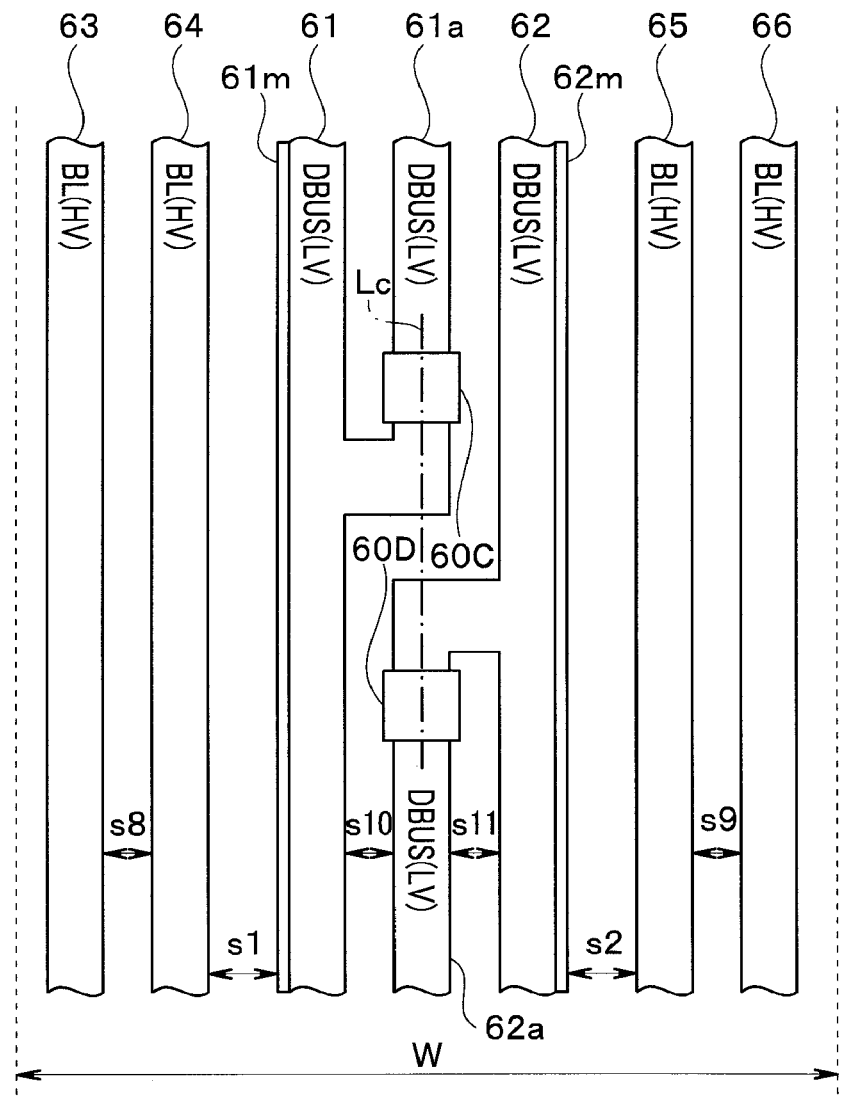
FIG. 13 is a diagram illustrating an example of respective wiring patterns for bit lines and buses in a wiring layer in a wiring layer region according to the embodiment.

FIG. 13 is a diagram illustrating an example of respective wiring patterns for the bit lines BL (lower bit lines BLL) and the buses DBUS in the wiring layer D0 in the wiring layer region WR. FIG. 13 illustrates a partial region of the wiring layer D0 above each of the tap hookup regions TH1 and TH2. In the wiring layer D0, the plurality of bit lines BL and the plurality of buses DBUS are formed parallel to the XY plane. The plurality of wiring patterns illustrated in FIG. 13 are respectively part of wiring portions on the way to the plurality of hookup circuits from the plurality of connection portions (i.e., tap portions) in each of the tap hookup regions TH1 and TH2.

A signal having a potential of a maximum of tens of bolts is applied to the bit line BL. On the other hand, a voltage of a maximum of several bolts is applied to the bus DBUS. In other words, a potential higher than the potential applied to the bus DBUS is applied to the bit line BL. A signal having a higher voltage-type (hereinafter referred to as HV-type) potential than the potential applied to the bus DBUS is applied to the bit line BL. A signal having a lower voltage-type (hereinafter referred to as LV-type) potential than the potential applied to the bit line BL is applied to the bus DBUS.

FIG. 13 illustrates wiring patterns 61 and 62 for the two LV-type buses DBUS and wiring patterns 63, 64, 65, and 66 for the four HV-type bit lines BL (lower bit lines BLL). The wiring patterns 61 and 62 are collected, the wiring patterns 63 and 64 are also collected, and the wiring patterns 65 and 66 are collected.

The wiring patterns 61 and 62 are respectively a plurality of (here, two) wiring patterns which are formed within the wiring layer D0 provided between the memory cell array 23 and the semiconductor substrate 30, extend in a predetermined direction, and are formed to be adjacent to each other. The wiring patterns 63 and 64 are respectively a plurality of (here, two) wiring patterns which are formed to be parallel to each other in a predetermined direction and be adjacent to each other within the wiring layer D0 and to which higher potentials than potentials applied to the wiring patterns 61 and 62 are respectively applied. The wiring patterns 65 and 66 are respectively wiring patterns formed to be parallel to each other in a predetermined direction and be adjacent to each other within the wiring layer D0 and similar to the wiring patterns 63 and 64. A space s1 between the wiring patterns 61 and 64 and a space s2 between the wiring patterns 62 and 65 are determined according to a wiring pitch considering a withstand voltage corresponding to a potential difference because the wiring patterns are respectively wirings in the same layer.

The wiring pattern 61 is a low-potential wiring which is formed in the wiring layer D0, at least a portion of which extends in an extension direction (an X-direction or a first direction) of the bit line BL, and which is adjacent to the wiring pattern 64 positioned on one side in an extension direction (a Y-direction or a second direction) of the word line WL out of the wiring patterns 63 and 64 with the predetermined space (distance) s1 interposed therebetween.

The wiring pattern 62 is a low-potential wiring which is formed in the wiring layer D0, at least a portion of which extends in the extension direction (X-direction or first direction) of the bit line BL, and which is adjacent to the wiring pattern 65 positioned on the other side in the extension direction (Y-direction or second direction) of the word line WL out of the wiring patterns 65 and 66 with the predetermined space (distance) s2 interposed therebetween.

The wiring patterns 63, 64, 65, and 66 are respectively high-potential wirings which are formed in the wiring layer D0 between the memory cell array 23 and the semiconductor substrate 30, at least respective portions of which extend in the extension direction (X-direction or first direction) of the bit line BL, which are adjacent to one another with predetermined distances interposed thereamong in the extension direction (Y-direction or second direction) of the word line WL perpendicular to the bit line BL, and to which a high potential is applied.

A margin region 61m for obtaining a lithography margin between the wiring patterns 61 and 64 is formed in an extension direction of the wiring pattern 61 on the side of the wiring pattern 64 in the wiring pattern 61. Similarly, a margin region 62m for obtaining a lithography margin between the wiring patterns 62 and 65 is formed in an extension direction of the wiring pattern 62 on the side of the wiring pattern 65 in the wiring pattern 62. Note that the margin regions 61m and 62m need not be provided.

Figure 14:
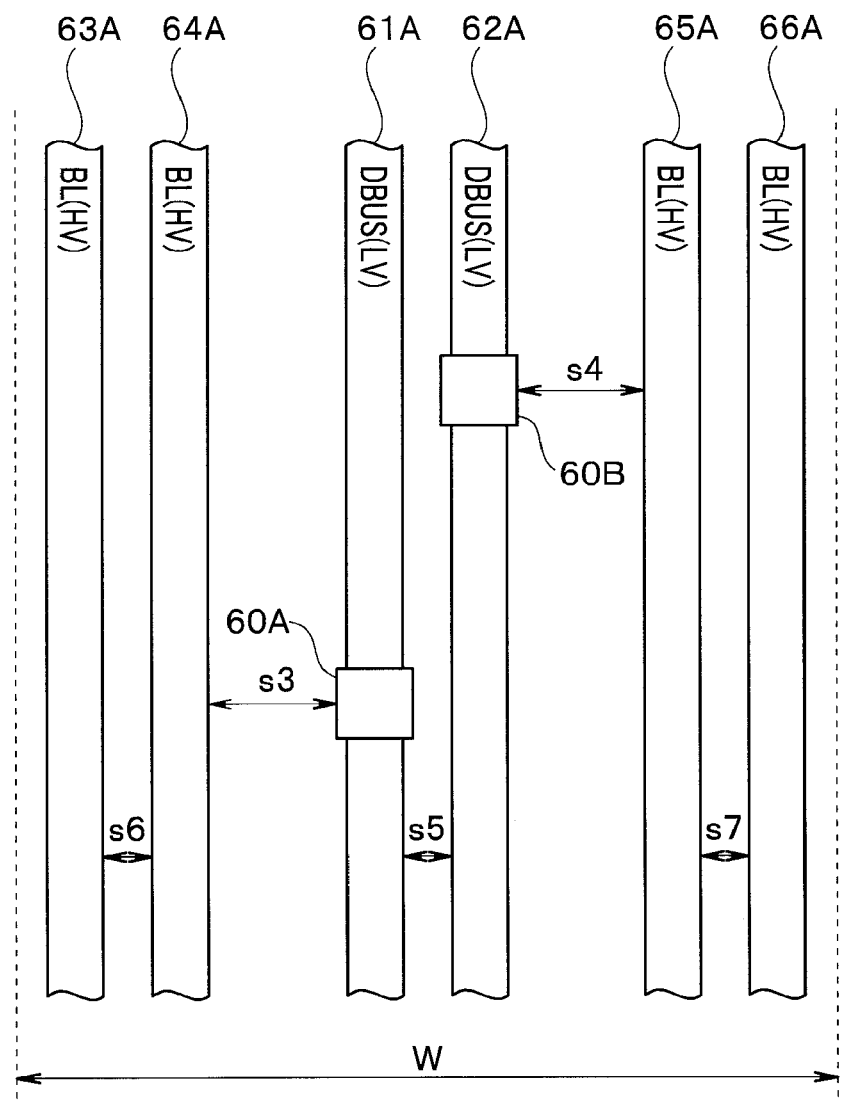
FIG. 14 is a diagram illustrating an example of wiring patterns as a comparative example with the wiring patterns illustrated in FIG. 13 according to the embodiment.

FIG. 14 is a diagram illustrating an example of wiring patterns as a comparative example with the wiring patterns illustrated in FIG. 13. FIG. 14 illustrates respective wiring patterns 61A and 62A for two buses DBUS and respective wiring patterns 63A, 64A, 65A, and 66A for the four bit lines BL (lower bit lines BLL). The wiring patterns 61A and 62A are respectively provided with vias 60A and 60B to be connected to conductors which penetrate the wiring patterns in an upward or downward direction as the Z-direction. The vias 60A and 60B are respectively connection regions with the conductors.

In the wiring patterns illustrated in FIG. 14, the vias 60A and 60B are respectively formed in the wiring patterns 61A and 62A. Thus, a space s3 between the via 60A and the wiring pattern 64A and a space s4 between the via 60B and the wiring pattern 65A are determined based on a wiring pitch (hereinafter also referred to as a withstand voltage pitch) considering a withstand voltage corresponding to a potential difference because the wiring patterns are respectively wirings in the same layer. The wiring pitch considering the withstand voltage is wider than a minimum wiring pitch. Thus, the space s3 between the via 60A and the wiring pattern 64A and the space s4 between the via 60B and the wiring pattern 65A are larger, i.e., wider than the space s1 between the wiring patterns 61 and 64 and the space s2 between the wiring patterns 62 and 65 illustrated in FIG. 13.

A space s5 between the wiring patterns 61A and 62A, a space s6 between the wiring patterns 63A and 64A, and a space s7 between the wiring patterns 65A and 66A illustrated in FIG. 14 are determined based on the minimum wiring pitch in the lithography.

Although the space s3 between the via 60A and the wiring pattern 64A and the space s4 between the via 60B and the wiring pattern 65A are determined based on the withstand voltage pitch, a danger point due to the lithography may occur in the wiring patterns 61A, 62A, 64A, and 65A if the spaces s3 and s4 are widened in consideration of the withstand voltage.

Although the danger point due to the lithography needs to be inhibited from occurring and a layout of the wiring patterns also needs to be determined in consideration of the withstand voltage, when the plurality of wiring patterns become larger than a size in an XY direction of the NAND memory cell array 23 determined by a pitch among the bit lines BL due to one of the bit lines BL, this also results in an increased size of a semiconductor memory chip.

In the example illustrated in FIG. 13, the plurality of LV-type buses DBUS are collected, branch wiring patterns are respectively formed on inner sides of the buses DBUS on outermost sides, and vias are respectively provided on the branch wiring patterns so that a withstand voltage pitch between an HV-type wiring pattern and an LV-type wiring pattern need not be considered. Further, the plurality of wiring patterns 63 and 64 for the HV-type bit lines BL (lower bit lines BLL) are collected, and the plurality of wiring patterns 65 and 66 for the HV-type bit lines BL (lower bit lines BLL) are also collected. When the wiring patterns of the same type are thus collected, a number of spaces considering the withstand voltage pitch decreases. Therefore, the semiconductor memory chip on the XY plane can be inhibited from increasing in size.

Referring to FIG. 13 again, a branch wiring pattern 61a which branches off from the wiring pattern 61 and a branch wiring pattern 62a which branches off from the wiring pattern 62 are provided between the two wiring patterns 61 and 62. Each of the branch wiring patterns 61a and 62a is formed between the two wiring patterns 61 and 62.

Particularly, as illustrated in FIG. 13, the branch wiring patterns 61a and 62a respectively branch off from the two first wiring patterns 61 and 62 on outermost sides among the plurality of (here, two) LV-type wiring patterns to respective inner sides of the plurality of LV-type wiring patterns, and are formed to be parallel to each other in a predetermined direction within the wiring layer D0.

The branch wiring pattern 61a is a branch wiring electrically connected to the wiring pattern 61, adjacent to the wiring pattern 61 with a predetermined space (distance) s10 interposed therebetween on one side, in the extension direction (Y-direction or second direction) of the word line WL, of the wiring pattern 61, and extending in the extension direction (X-direction or first direction) of the bit line BL.

The branch wiring pattern 62a is a branch wiring electrically connected to the wiring pattern 62, adjacent to the wiring pattern 62 with a predetermined space (distance) s11 interposed therebetween on the other side, in the extension direction (Y-direction or second direction) of the word line WL, of the wiring pattern 62, and extending in the extension direction (X-direction or first direction) of the bit line BL.

Therefore, no high potential is supplied to the wiring patterns 61 and 62 and the branch wiring patterns 61a and 62a.

The wiring patterns 61, 62, 63, 64, 65, and 66 and the two branch wiring patterns 61a and 62a are disposed above each of the tap hookup regions TH1 and TH2 as connection regions with the signal lines from the memory cell array 23, provided on the semiconductor substrate 30 loaded with the peripheral circuits around the memory cell array 23. In other words, the wiring patterns 61, 62, 63, 64, 65, and 66 and the two branch wiring patterns 61a and 62a are arranged to overlap the hookup region, as viewed in a direction (Z-direction or third direction) perpendicular to the extension direction (X-direction or first direction) of the bit line BL and the extension direction (Y-direction or second direction) of the word line WL.

As illustrated in FIG. 13, the HV-type wiring patterns 63 to 66 are formed on the plane parallel to the XY plane. As described above, the plurality of (here, two) wiring patterns 63 and 64 are collectively formed as one group to be parallel to each other. Similarly, a plurality of (here, two) wiring patterns 65 and 66 are collectively formed as one group to be parallel to each other. A space s8 between the two wiring patterns 63 and 64 and a space s9 between the two wiring patterns 65 and 66 are determined according to the minimum wiring pitch.

The LV-type wiring patterns 61 and 62 are also formed on the plane parallel to the XY plane. The plurality of (here, two) wiring patterns 61 and 62 are collectively formed as one group to be parallel to each other. Further, the two wiring patterns 61 and 62 are formed to be parallel to the two wiring patterns 63 and 64 and be also parallel to the two wiring patterns 65 and 66.

The branch wiring pattern 61a is formed to extend from the wiring pattern 61 in a direction parallel to the XY plane and perpendicular to the extension direction of the wiring pattern 61 and then in a direction parallel to the XY plane and parallel to the extension direction of the wiring pattern 61.

The branch wiring pattern 62a is formed to extend from the wiring pattern 62 in a direction parallel to the XY plane and perpendicular to the extension direction of the wiring pattern 62 and then in a direction parallel to the XY plane and parallel to the extension direction of the wiring pattern 62. The branch wiring patterns 61a and 62a are formed to respectively extend in opposite directions along a virtual line Lc parallel to the two wiring patterns 61 and 62. In other words, the two branch wiring patterns 61a and 62a are formed on the same virtual straight line Lc.

The two branch wiring patterns 61a and 62a are respectively provided with vias 60C and 60D. Each of the vias 60C and 60D is a via region as a connection region with the conductor in the Z-direction for electrical connection with the sense amplifier circuit 24. In other words, no via is formed in the wiring patterns 61 and 62, the via 60C is provided to contact the branch wiring pattern 61a, and the via 60D is provided to contact the branch wiring pattern 62a. Since the vias 60C and 60D are arranged along the virtual line Lc, a width of a region where each of the LV-type wiring patterns 61 and 62 is provided is not increased in a direction perpendicular to the direction in which the plurality of wiring patterns 61 to 66 extend.

In a case illustrated in FIG. 13, the space s8 between the wiring patterns 63 and 64, the space s9 between the wiring patterns 65 and 66, the space s10 between the wiring pattern 61 and the branch wiring patterns 61a and 62a, and the space s11 between the wiring pattern 62 and the branch wiring patterns 62a and 61a are determined and set according to the minimum wiring pitch in the lithography. The spaces s8 and s9 and the spaces s10 and s11 are equal to each other, and the spaces s1 and s2 are larger than the spaces s8 and s9.

Although the LV-type wiring patterns are the two wiring patterns 61 and 62 in the above-described embodiment, the above-described embodiment is also applicable to a case where the LV-type wiring patterns are three or more wiring patterns.

Figure 15:
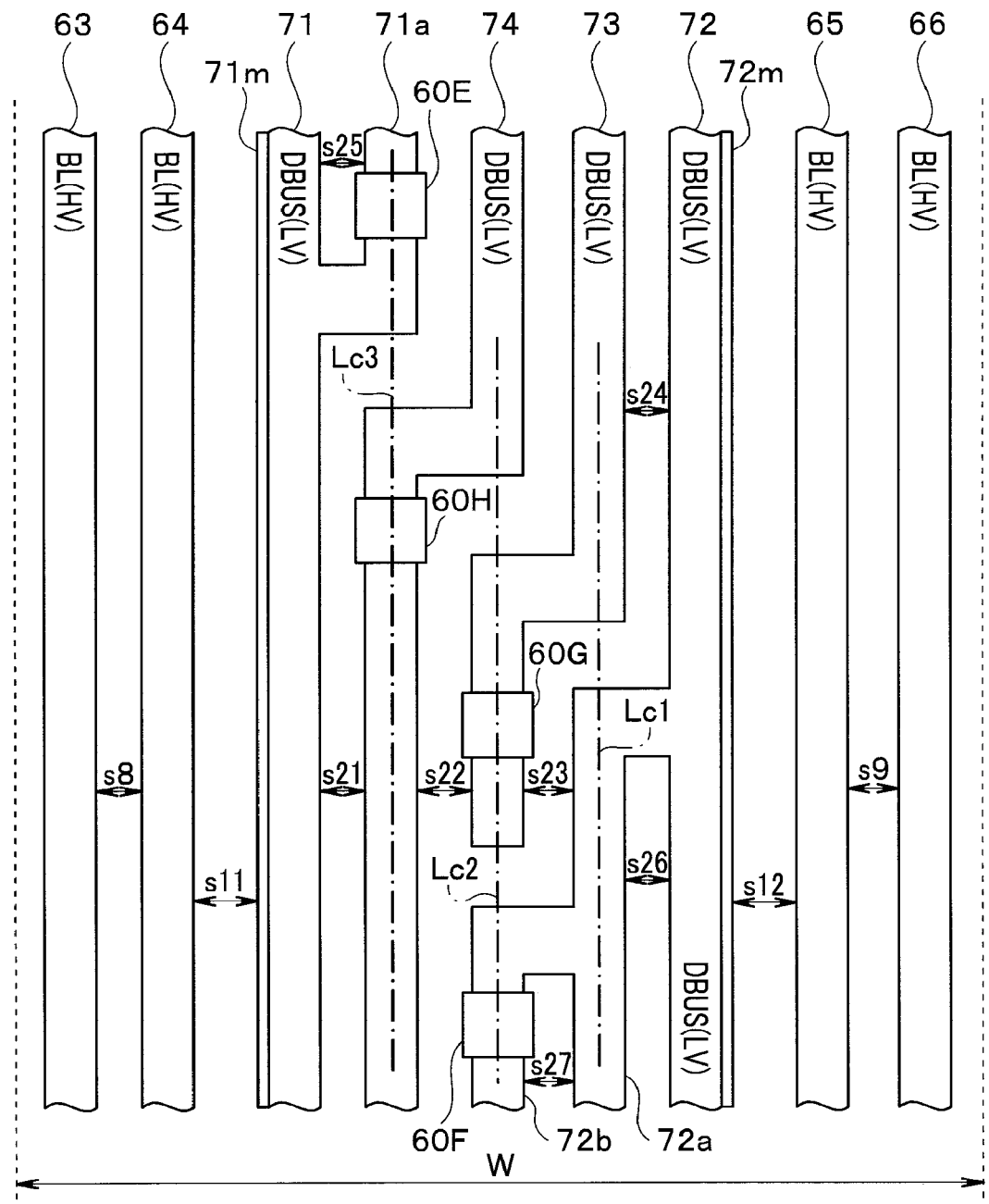
FIG. 15 is a diagram illustrating another example of wiring patterns for bit lines and buses in a wiring layer in a wiring layer region according to the embodiment.

FIG. 15 is a diagram illustrating another example of wiring patterns for bit lines and buses in a wiring layer in a wiring layer region according to the embodiment. FIG. 15 is a diagram illustrating an example of respective wiring patterns for bit lines and DBUS lines in a wiring layer D0 of a wiring layer region WR when the number of LV-type wiring patterns is four. In FIG. 15, the same components as the components illustrated in FIG. 13 are assigned the same reference numerals, and hence description is omitted.

In FIG. 15, respective wiring patterns 71, 72, 73, and 74 for four LV-type buses DBUS are provided between respective wiring patterns 63 and 64 for two HV-type bit lines BL (lower bit lines BLL) and respective wiring patterns 65 and 66 for two HV-type bit lines BL (lower bit lines BLL). The wiring patterns 71, 72, 73, and 74 are collected. A space s11 between the wiring patterns 71 and 64 and a space s12 between the wiring patterns 72 and 65 are determined based on a wiring pitch considering a withstand voltage corresponding to a potential difference because the wiring patterns are respectively wirings in the same layer.

A margin region 71m for obtaining a lithography margin between the wiring patterns 71 and 64 is formed in an extension direction of the wiring pattern 71 on the side of the wiring pattern 64 in the wiring pattern 71. Similarly, a margin region 72m for obtaining a lithography margin between the wiring patterns 72 and 65 is formed in an extension direction of the wiring pattern 72 on the side of the wiring pattern 65 in the wiring pattern 72. Note that the margin regions 71m and 72m may not be provided.

The wiring pattern 71 adjacent to the wiring pattern 64 includes a branch wiring pattern 71a on the opposite side to the wiring pattern 64. More specifically, the branch wiring pattern 71a is formed to extend from the wiring pattern 71 in a direction parallel to the XY plane and perpendicular to the extension direction of the wiring pattern 71 and then in a direction parallel to the XY plane and parallel to the extension direction of the wiring pattern 71.

The wiring pattern 72 adjacent to the wiring pattern 65 includes a branch wiring pattern 72a on the opposite side to the wiring pattern 65. Further, the branch wiring pattern 72a includes a branch wiring pattern 72b on the opposite side to the wiring pattern 72.

The wiring patterns 71 to 74 and 63 to 66 and the three branch wiring patterns 71a, 72a, and 72b are disposed above each of tap hookup regions TH1 and TH2, as a connection region with a signal line from the memory cell array 23, provided on the semiconductor substrate 30 loaded with the peripheral circuits around the memory cell array 23.

More specifically, the branch wiring pattern 72a is formed to extend from the wiring pattern 72 in a direction parallel to the XY plane and perpendicular to the extension direction of the wiring pattern 72 and then in a direction parallel to the XY plane and parallel to the extension direction of the wiring pattern 72. The branch wiring pattern 72b is formed to extend from the branch wiring pattern 72a in a direction parallel to the XY plane and perpendicular to an extension direction of the branch wiring pattern 72a and then in a direction parallel to the XY plane and parallel to the extension direction of the branch wiring pattern 72a.

The wiring patterns 73 and 74 are formed in a crank shape as viewed in a direction perpendicular to an extension direction (an X-direction or a first direction) of the bit line BL and an extension direction (a Y-direction or a second direction) of a word line WL. More specifically, the wiring pattern 73 is formed adjacent to the wiring pattern 72 and includes a portion formed along a virtual line Lc1 in the extension direction of the branch wiring pattern 72a and a portion formed along a virtual line Lc2 in an extension direction of the branch wiring pattern 72b. In other words, the wiring pattern 73 includes a first portion and a second portion each extending in the extension direction (X-direction or first direction) of the bit line BL. The second portion is electrically connected to the first portion, extends in the extension direction (X-direction or first direction) of the bit line BL, and is adjacent to a branch wiring pattern 61a with a predetermined space (distance) s22 interposed therebetween in the extension direction (Y-direction or second direction) of the word line WL.

The wiring pattern 74 is also formed in a crank shape. In other words, the wiring patterns 73 and 74 are respectively wiring patterns each having a crank shape and formed to be parallel to each other in a predetermined direction within the wiring layer D0 and formed between the two wiring patterns 71 and 72 on outermost sides. The wiring pattern 74 is formed adjacent to the wiring pattern 71, and includes a portion formed along a virtual line Lc3 in an extension direction of the branch wiring pattern 71a and a portion formed along the above-described virtual line Lc2. In other words, the branch wiring pattern 71a is formed on a virtual straight line Lc3 on which a portion of the wiring pattern 74 having a crank shape is formed. The branch wiring pattern 72a is formed on a virtual straight line Lc1 on which a portion of the wiring pattern 73 having a crank shape is formed. The portion of the wiring pattern 74, the portion of the wiring pattern 73, and the branch wiring pattern 72b are formed along the virtual line Lc2.

Particularly, as illustrated in FIG. 15, the branch wiring patterns 71a and 72a respectively branch off from the two first wiring patterns 71 and 72 on the outermost sides among the four wiring patterns 71 to 74 to respective inner sides of the wiring patterns 71 to 74, and are formed to be parallel to each other in a predetermined direction within the wiring layer D0.

Four vias 60E, 60F, 60G, and 60H respectively associated with the four wiring patterns 71, 72, 73, and 74 are provided. The via 60E is provided in the branch wiring pattern 71a. The via 60F is provided in the branch wiring pattern 72b. The via 60G is provided in a portion formed along the virtual line Lc2 in the wiring pattern 73. The via 60H is provided in a portion formed along the virtual line Lc3 in the wiring pattern 74. In other words, the vias 60G and 60H for electrical connection with the sense amplifier circuit 24 are respectively provided in the wiring patterns 73 and 74. The space s11 between the wiring patterns 71 and 64 and the space s12 between the wiring patterns 72 and 65 are determined based on a withstand voltage pitch corresponding to a potential difference because the wiring patterns are respectively wirings in the same layer.

A space s21 between the wiring patterns 71 and 74, a space s22 between the wiring patterns 73 and 74, a space s23 between the wiring pattern 73 and the branch wiring pattern 72a, and a space s24 between the wiring patterns 72 and 73 are also determined according to a minimum wiring pitch, like the space s8 between the two wiring patterns 63 and 64 and the space s9 between the two wiring patterns 65 and 66. A space s25 between the wiring pattern 71 and the branch wiring pattern 71a, a space s26 between the wiring pattern 72 and the branch wiring pattern 72a, and a space s27 between the branch wiring pattern 72a and the branch wiring pattern 72b are also determined according to the minimum wiring pitch.

Figure 16:
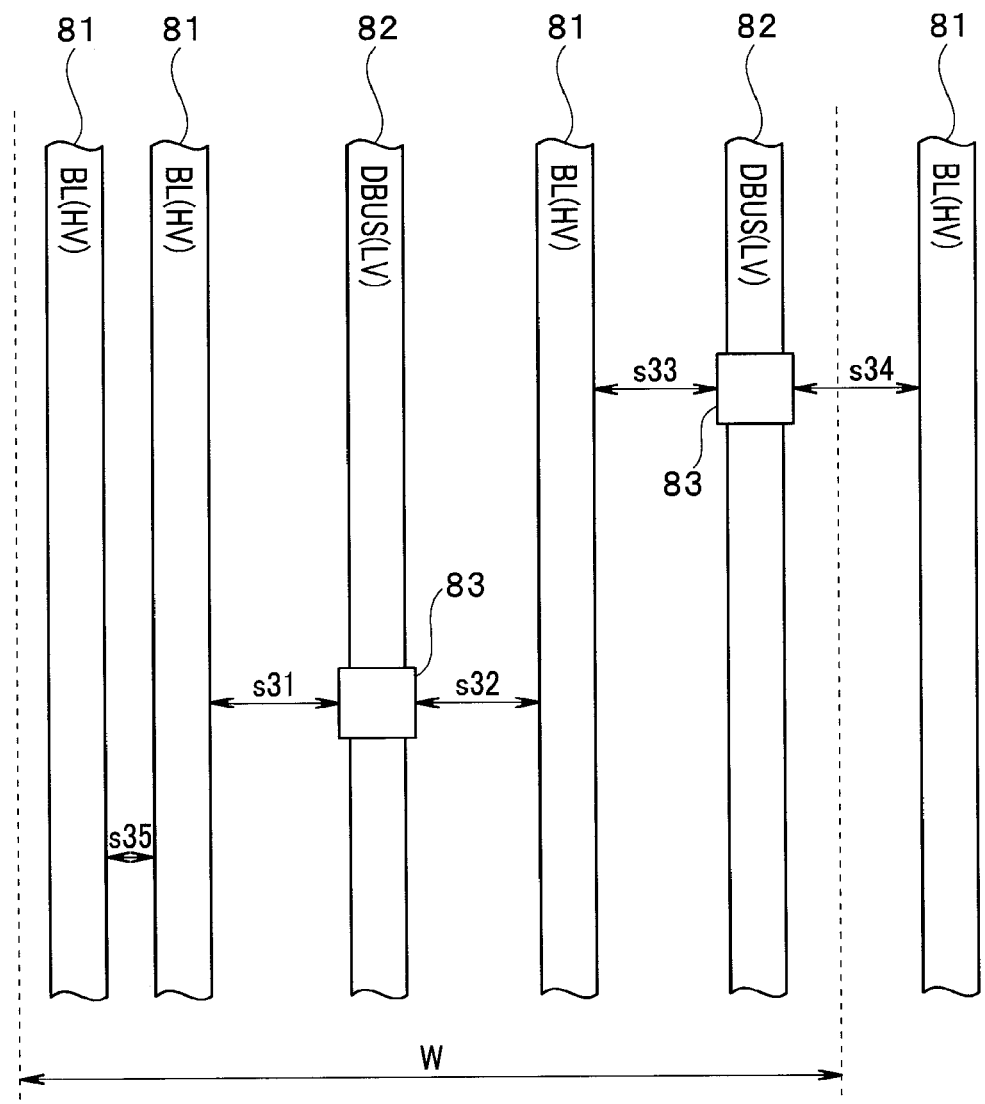
FIG. 16 is a diagram illustrating a comparative example of wiring patterns according to the embodiment.

FIG. 16 is a diagram illustrating a comparative example of wiring patterns according to the above-described embodiment. In FIG. 16, a plurality of wiring patterns are formed such that HV-type wiring patterns 81 and LV-type wiring patterns 82 are not respectively collected and vias 83 are respectively formed in the LV-type wiring patterns 82. The vias 83 are respectively provided in the two LV-type wiring patterns 82.

In FIG. 16, the HV-type wiring patterns and the LV-type wiring patterns are not respectively collected. Accordingly, spaces s31 and s32 and spaces s33 and s34, respectively, between the adjacent HV-type wiring patterns 81 and the vias 83 are determined according to a wiring pitch considering a withstand voltage. A space s35 between the HV-type wiring patterns 81 is determined according to a minimum wiring pitch. Accordingly, in FIG. 16, a width in which the six wiring patterns 81 and 82 including the HV-type and LV-type wiring patterns are formed may be larger than a pitch W between bit lines BL (lower bit lines BLL).

In FIGS. 13 and 15, compared with FIGS. 14 and 16, the HV-type wiring patterns and the LV-type wiring patterns are respectively collectively disposed, to reduce a region a space of which increases due to a withstand voltage while respectively providing vias to be provided in the LV-type wiring patterns in not the LV-type wiring patterns on outermost sides among the plurality of collected LV-type wiring patterns but branch wiring patterns which branch off from the LV-type wiring patterns on the outermost sides. As a result, if the plurality of HV-type wiring patterns and the plurality of LV-type wiring patterns exist as a mixture, a width of the plurality of wiring patterns can be within the pitch W between the bit lines BL (lower bit lines BLL) in the NAND memory cell array 23.

Therefore, according to the above-described embodiment, there can be provided a semiconductor storage device configured not to increase a space between wiring patterns respectively having different potentials while complying with a withstand voltage between the wiring patterns.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a memory cell array comprising a plurality of memory cells each settable to any one of threshold voltages at a plurality of levels;
   a plurality of first high-potential wirings which are formed in a wiring layer between the memory cell array and a semiconductor substrate, at least respective portions of which extend in a first direction, which are adjacent to one another with a first distance in a second direction perpendicular to the first direction, and to which a high potential is applied,
   a plurality of second high-potential wirings which are formed in the wiring layer, at least respective portions of which extend in the first direction, which are adjacent to one another with the first distance in the second direction, and to which the high potential is applied;
   a first low-potential wiring which is formed in the wiring layer, at least a portion of which extends in the first direction, and which is adjacent to the first high-potential wiring positioned on one side in the second direction among the plurality of first high-potential wirings with a second distance;
   a second low-potential wiring which is formed in the wiring layer, at least a portion of which extends in the first direction, and which is adjacent to the second high-potential wiring positioned on another side in the second direction among the plurality of second high-potential wirings with the second distance;
   a first branch wiring which is electrically connected to the first low-potential wiring, is adjacent to the first low-potential wiring with a third distance on the one side in the second direction of the first low-potential wiring, and extends in the first direction;
   a second branch wiring which is electrically connected to the second low-potential wiring, is adjacent to the second low-potential wiring with the third distance on the other side in the second direction of the second low-potential wiring, and extends in the first direction;
   a first via provided to contact the first branch wiring; and
   a second via provided to contact the second branch wiring.

2. The semiconductor storage device according to claim 1, wherein the first branch wiring and the second branch wiring are formed on a same virtual straight line.

3. The semiconductor storage device according to claim 2, further comprising
   a plurality of bit lines connected to the memory cell array,
   a sense amplifier region which is arranged on the semiconductor substrate and in which a plurality of sense amplifier units are arranged, and
   a hookup region which is arranged on the semiconductor substrate and in which a plurality of hookup circuits each including a high withstand voltage transistor and respectively connecting the plurality of bit lines and the plurality of sense amplifier units to each other are arranged,
   wherein the first high-potential wirings, the second high-potential wirings, the first low-potential wiring, the second low-potential wiring, the first branch wiring, and the second branch wiring are arranged to overlap the hookup region as viewed in a third direction perpendicular to the first direction and the second direction.

4. The semiconductor storage device according to claim 1, further comprising
   a third low-potential wiring which is formed in the wiring layer, at least a portion of which extends parallel to the first direction, and which is arranged on a virtual straight line on which the first branch wiring is arranged, and
   a third via provided to contact the third low-potential wiring.

5. The semiconductor storage device according to claim 4, wherein the third low-potential wiring further comprises another portion which is electrically connected to at least the portion, extends in the first direction, and is adjacent to the first branch wiring with the third distance in the second direction.

6. The semiconductor storage device according to claim 5, wherein the third low-potential wiring has a crank shape as viewed in a third direction perpendicular to the first direction and the second direction.

7. The semiconductor storage device according to claim 6, further comprising
   a plurality of bit lines connected to the memory cell array,
   a sense amplifier region which is arranged on the semiconductor substrate and in which a plurality of sense amplifier units are arranged, and
   a hookup region which is arranged on the semiconductor substrate and in which hookup circuits each including a high withstand voltage transistor and respectively connecting the bit lines and the sense amplifier units to each other are arranged,
   wherein the first high-potential wirings, the second high-potential wirings, the first low-potential wiring, the second low-potential wiring, the first branch wiring, the second branch wiring, and the third low-potential wiring are arranged to overlap the hookup region as viewed in a third direction perpendicular to the first direction and the second direction.

8. The semiconductor storage device according to claim 1, wherein the high potential is not supplied to the first low-potential wiring, the second low-potential wiring, the first branch wiring, and the second branch wiring.

9. The semiconductor storage device according to claim 1, wherein no via is formed in the first low-potential wiring and the second low-potential wiring.

10. The semiconductor storage device according to claim 1, wherein
    the first distance and the third distance are equal to each other, and
    the second distance is larger than the first distance.

11. A semiconductor storage device comprising:
- a memory cell array comprising a plurality of memory cells each settable to any one of threshold voltages at a plurality of levels;
- a first wiring which is formed in a wiring layer between the memory cell array and a semiconductor substrate, at least a portion of which extends in a first direction, and which has a first width in a second direction perpendicular to the first direction;
- a second wiring which is formed in the wiring layer, at least a portion of which extends in the first direction, which is adjacent to the first wiring with a first distance in the second direction, and which has the first width;
- a third wiring which is formed in the wiring layer, at least a portion of which extends in the first direction, and which is adjacent to the second wiring with a second distance in the second direction;
- a fourth wiring which is formed in the wiring layer, at least a portion of which extends in the first direction, and which is electrically connected to the third wiring while being adjacent to the third wiring with a third distance in the second direction;
- a fifth wiring which is formed in the wiring layer, at least a portion of which extends in the first direction, and which is adjacent to the fourth wiring with the third distance in the second direction;
- a sixth wiring which is formed in the wiring layer, at least a portion of which extends in the first direction, and which is electrically connected to the fifth wiring while being arranged on a virtual straight line on which the fourth wiring is arranged;
- a first via provided to contact the fourth wiring; and
- a second via provided to contact the six wiring.

12. The semiconductor storage device according to claim 11, further comprising
- a plurality of bit lines connected to the memory cell array,
- a sense amplifier region which is arranged on the semiconductor substrate and in which a plurality of sense amplifier units are arranged, and
- a hookup region which is arranged on the semiconductor substrate and in which a plurality of hookup circuits each including a high withstand voltage transistor and respectively connecting the plurality of bit lines and the plurality of sense amplifier units to each other are arranged,
- wherein the first to sixth wirings are arranged to overlap the hookup region as viewed in a third direction perpendicular to the first direction and the second direction.

13. The semiconductor storage device according to claim 11, further comprising
- a seventh wiring which connects the fifth wiring and the six wiring,
- wherein the fifth to seventh wirings each have a crank shape as viewed in a third direction perpendicular to the first direction and the second direction.

14. The semiconductor storage device according to claim 13, further comprising
- a plurality of bit lines connected to the memory cell array,
- a sense amplifier region which is arranged on the semiconductor substrate and in which a plurality of sense amplifier units are arranged, and
- a hookup region which is arranged on the semiconductor substrate and in which hookup circuits each including a high withstand voltage transistor and respectively connecting the bit lines and the sense amplifier units to each other are arranged,
- wherein the first to seventh wirings are arranged to overlap the hookup region as viewed in the third direction perpendicular to the first direction and the second direction.

15. The semiconductor storage device according to claim 11, wherein the high potential is not supplied to the third to sixth wirings.

16. The semiconductor storage device according to claim 11, wherein no via is formed in the third wiring and the fifth wiring.

17. The semiconductor storage device according to claim 11, wherein
- the first distance and the third distance are equal to each other, and
- the second distance is larger than the first distance.

18. A semiconductor storage device comprising:
- a memory cell array comprising a plurality of memory cells each settable to any one of threshold voltages at a plurality of levels;
- a plurality of first wirings which are formed in a wiring layer provided between the memory cell array and a semiconductor substrate, at least respective portions of which extend in a first direction, and to which a first potential is applied only when data in the memory cell array is read out and written;
- a plurality of second wirings which are formed in the wiring layer, at least respective portions of which extend in the first direction, which are connected to a latch circuit in which data associated with the reading and the writing of the data in the memory cell array is latched, and to which a second potential is applied;
- a first branch wiring which is electrically connected to one of the two first wirings on outermost sides among the plurality of first wirings, branches off to one side in a second direction perpendicular to the first direction, and extends in the first direction;
- a second branch wiring which is electrically connected to another of the two first wirings on the outermost sides among the plurality of first wirings, branches off to another side in the second direction, and extends in the first direction;
- a first via provided to contact the first branch wiring; and
- a second via provided to contact the second branch wiring.

19. The semiconductor storage device according to claim 18, wherein the first branch wiring and the second branch wiring are formed on a same virtual straight line.

20. The semiconductor storage device according to claim 19, wherein
- the plurality of first wirings are respectively a plurality of bit lines connected to the memory cell array,
- a sense amplifier region which is arranged on the semiconductor substrate and in which a plurality of sense amplifier units are arranged, and
- a hookup region which is arranged on the semiconductor substrate and in which a plurality of hookup circuits each including a high withstand voltage transistor and respectively connecting the plurality of bit lines and the plurality of sense amplifier units to each other are arranged,
- wherein the first wirings, the second wirings, the first branch wiring, and the second branch wiring are arranged to overlap the hookup region as viewed in a third direction perpendicular to the first direction and the second direction.

* * * * *